(12) United States Patent
Van der Velden

(10) Patent No.: US 11,645,435 B2
(45) Date of Patent: May 9, 2023

(54) FAST METHOD FOR COMPUTER-BASED SIMULATION

(71) Applicant: Dassault Systemes Simulia Corp., Johnston, RI (US)

(72) Inventor: Alexander Jacobus Maria Van der Velden, Atlanta, GA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 731 days.

(21) Appl. No.: 16/447,252

(22) Filed: Jun. 20, 2019

(65) Prior Publication Data

US 2020/0401672 A1 Dec. 24, 2020

(51) Int. Cl.
*G06F 30/23* (2020.01)
*G06N 20/00* (2019.01)
*G06N 7/00* (2023.01)

(52) U.S. Cl.
CPC .............. *G06F 30/23* (2020.01); *G06N 7/00* (2013.01); *G06N 20/00* (2019.01)

(58) Field of Classification Search
CPC .......... G06F 30/23; G06F 30/27; G06F 30/10; G06N 20/00; G06N 7/00; G16C 60/00
See application file for complete search history.

(56) References Cited

U.S. PATENT DOCUMENTS

| | | | | |
|---|---|---|---|---|
| 5,673,371 | A * | 9/1997 | Koopman | G06K 15/02 395/110 |
| 2010/0131256 | A1* | 5/2010 | Hallquist | B23K 11/34 703/6 |
| 2010/0235149 | A1* | 9/2010 | Allen | G06F 30/15 703/2 |
| 2011/0170373 | A1* | 7/2011 | Hsu | G01V 1/282 367/73 |
| 2017/0322145 | A1* | 11/2017 | McElroy | G01N 3/00 73/799 |

(Continued)

FOREIGN PATENT DOCUMENTS

| | | |
|---|---|---|
| JP | H02310602 | 12/1990 |
| JP | 2008142774 | 6/2008 |
| JP | 2008161896 | 7/2008 |

OTHER PUBLICATIONS

Han Bao, "A data-driven framework for error estimation and mesh-model optimization in system-level thermal-hydraulic simulation", Apr. 22, 2019, Nuclear Engineering and Design, vol. 349, pp. 27-45 (Year: 2019).*

(Continued)

*Primary Examiner* — Andre Pierre Louis
(74) *Attorney, Agent, or Firm* — Hamilton, Brook, Smith & Reynolds. P.C.

(57) ABSTRACT

Embodiments provide methods and systems for performing computer-based simulations of real-world objects. In one such embodiment, a mesh-based model representing a real-world object and composed of a plurality of mesh elements each having geometric properties is obtained. In turn, a simulation of physical behavior of the real-world object is performed using the mesh-based model. According to an embodiment, performing the simulation includes, for at least one mesh element, modifying as a function of the geometric properties, measurement values, amounts, or levels of material properties used to determine the physical behavior.

19 Claims, 15 Drawing Sheets

(56) References Cited

U.S. PATENT DOCUMENTS

2018/0240244 A1* 8/2018 Uyyala .............. G06K 9/00201
345/424
2018/0330029 A1 11/2018 Pedersen et al.

OTHER PUBLICATIONS

Phillip Keane, "CF-MESH+ Is Used to Solve Turbulent Flow Simulation on DrivAer", Mar. 1, 2019, www.engineering.com, p. 3 (Year: 2019).*
GoEngineer, "Using Sheet Metal Bodies in Solidworks Simulation", Dec. 3, 2018, www.goengineer.com, pp. 1-2 (Year: 2018).*
Fusahito Yoshida, "Elastic-plastic behavior of steel sheets under in-plane cyclic tension-compression at large strain", May 1, 2001, International Journal of Plasticity, vol. 18, pp. 633-634, 656 (Year: 2001).*
Ahmad, N. E. ., Abo-Serie, E. ., & Gaylard, A. . (2010). Mesh Optimization for Ground Vehicle Aerodynamics. CFD Letters, 2(1), 54-65. Retrieved from https://akademiabaru.com/submit/index.php/cfdl/article/view/3317/2348 (Year: 2010).*
Han Bao, "A data-driven framework for error estimation and mesh-model optimization in system-level thermal-hydraulic simulation", Apr. 22, 2019, Nuclear Engineering and Design, vol. 349, pp. 27-45 (Year: 2019) (Year: 2019).*
Stringfellow, R, & Paetsch, C. "Modeling Material Failure During Cab Car End Frame Impact." Proceedings of the 2009 Joint Rail Conference. 2009 Joint Rail Conference. Pueblo, Colorado, USA. Mar. 4-5, 2009. pp. 183-192. ASME. https://doi.org/10.1115/JRC2009-63054 (Year: 2009).*
Altair, "Optimizing High Fidelity Crash & Safety Simulation Performance: A Cray-Altair Solution for Manufacturing," 4 pages total (2013).
Dassault Systemes, "Abaqus Unified FEA," 6 pages total (2013).
Dassault Systemes, "Strain measures," 2 pages total (Nov. 2018).
Hamza et al., "Design Optimization of Vehicle Structures for Crashworthiness Using Equivalent Mechanism Approximations," Journal of Mechanical Design, 127(3): 485-492 (May 2005).
Marzbanrad et al., "A Numerical and experimental study on the crash behavior of the extruded aluminum crash box with elastic support," Latin American Journal of Solids and Structures, 11(8): 1329-1348 (2014).
Extended European Search Report for European Application No. 20179863.4, entitled "A Fast Method for Computer-Based Simulation," dated Nov. 4, 2020.
Bao et al., "A data-driven framework for error estimation and mesh-model optimization in system-level thermal-hydraulic simulation," Nuclear Engineering and Design, 349 (2019) 27-45.

* cited by examiner

METHOD: VERY LARGE DOE SET

DATASET ~ 500K ENTRIES
EACH SIMULATION 9 - 30 CPUs
FOCUS ON 25mm MESH CASES

1100

| 1101 material | | | 1102 geometry | | | 1103 Material softening | | | 1104 scenario | | | 1105 mesh | | |
|---|---|---|---|---|---|---|---|---|---|---|---|---|---|---|
| E | yeld | rho | height | width | thick | cal | cal2 | cal3 | mass | velocity | i | G_height | G_length | G_width |
| 210000 | 700 | 7.8E-09 | 75 | 75 | 1 | 0.05 | 1 | 1 | 0.1 | -15646 | 1 | 25 | 25 | 25 |
| 210000 | 700 | 7.8E-09 | 75 | 75 | 1 | 0.075 | 1 | 1 | 0.1 | -15646 | 1 | 25 | 25 | 25 |
| 210000 | 700 | 7.8E-09 | 75 | 75 | 1 | 0.1 | 1 | 1 | 0.1 | -15646 | 1 | 25 | 25 | 25 |
| 210000 | 700 | 7.8E-09 | 75 | 75 | 1 | 0.125 | 1 | 1 | 0.1 | -15646 | 1 | 25 | 25 | 25 |
| 210000 | 700 | 7.8E-09 | 75 | 75 | 1 | 0.15 | 1 | 1 | 0.1 | -15646 | 1 | 25 | 25 | 25 |
| 210000 | 700 | 7.8E-09 | 75 | 75 | 1 | 0.175 | 1 | 1 | 0.1 | -15646 | 1 | 25 | 25 | 25 |
| 210000 | 700 | 7.8E-09 | 75 | 75 | 1 | 0.2 | 1 | 1 | 0.1 | -15646 | 1 | 25 | 25 | 25 |
| 210000 | 700 | 7.8E-09 | 75 | 75 | 1 | 0.225 | 1 | 1 | 0.1 | -15646 | 1 | 25 | 25 | 25 |
| 210000 | 700 | 7.8E-09 | 75 | 75 | 1 | 0.25 | 1 | 1 | 0.1 | -15646 | 1 | 25 | 25 | 25 |
| 210000 | 700 | 7.8E-09 | 75 | 75 | 1 | 0.275 | 1 | 1 | 0.1 | -15646 | 1 | 25 | 25 | 25 |
| 210000 | 700 | 7.8E-09 | 75 | 75 | 1 | 0.3 | 1 | 1 | 0.1 | -15646 | 1 | 25 | 25 | 25 |
| 210000 | 700 | 7.8E-09 | 87.5 | 75 | 1 | 0.05 | 1 | 1 | 0.1 | -15646 | 2 | 18.75 | 25 | 25 |
| 210000 | 700 | 7.8E-09 | 87.5 | 75 | 1 | 0.075 | 1 | 1 | 0.1 | -15646 | 1 | 18.75 | 25 | 25 |
| 210000 | 700 | 7.8E-09 | 87.5 | 75 | 1 | 0.1 | 1 | 1 | 0.1 | -15646 | 2 | 18.75 | 25 | 25 |
| 210000 | 700 | 7.8E-09 | 87.5 | 75 | 1 | 0.125 | 1 | 1 | 0.1 | -15646 | 2 | 18.75 | 25 | 25 | outputs 1106

| U3_5 | V3_5 | comp_lock | crash_U_ | Delkin | Delstrain | DelU3 | DelV3 | Ekin_2 |
|---|---|---|---|---|---|---|---|---|
| 305.814 | 4399.66 | -0.2336 | -321.292 | 57245 | -45777.8 | 15.478 | 318.27 | 13C |
| 305.814 | 4399.66 | -0.12398 | -315.821 | 26033.7 | -44254.4 | 10.007 | 828.94 | 995 |
| 305.814 | 4399.66 | -0.093 | -312.444 | 24199.5 | -23657.8 | 6.63 | -172.73 | 997 |
| 305.814 | 4399.66 | -0.153748 | -289.823 | -53274.8 | -62335.4 | -15.991 | 1728.67 | 202 |
| 305.814 | 4399.66 | 0.071439 | -276.044 | -50883.1 | -67582.8 | -29.77 | 6291.44 | 226 |
| 305.814 | 4399.66 | 0.033314 | -270.161 | -40580 | -54688.1 | -35.653 | 3800.96 | 32 |
| 305.814 | 4399.66 | -0.00632 | -265.988 | -47183.8 | -52774.9 | -39.826 | 28.81 | 263 |
| 305.814 | 4399.66 | 0.002222 | -261.589 | -45055.5 | -61766.4 | -44.225 | -1407.36 | 284 |
| 305.814 | 4399.66 | 0.021986 | -213.082 | -9332.6 | -40711.9 | -92.732 | -348.07 | 641 |
| 305.814 | 4399.66 | 0.044295 | -215.954 | -13057 | -34436.5 | -89.86 | -540.19 | 6C |
| 305.814 | 4399.66 | 0.070064 | -202.208 | -33676 | -62241.9 | -103.606 | -878.62 | 35 |
| 334.843 | 6525.53 | 0.0032233 | -338.135 | 6891.5 | 30751 | 3.292 | 712.23 | 937 |
| 334.843 | 6525.53 | 0.155419 | -326.442 | 14423.6 | -21950.1 | -8.401 | 230.64 | 101 |
| 334.843 | 6525.53 | 0.22203 | -317.474 | -20120.6 | -30255.4 | -17.369 | -256.51 | 667 |
| 334.843 | 6525.53 | 0.126279 | -316.44 | -33073 | -55742.1 | -18.403 | 631.99 | 538 |

FIG. 11

FAST METHOD FOR COMPUTER-BASED SIMULATION

BACKGROUND

A number of existing product and simulation systems are offered on the market for the design and simulation of parts, e.g., real-world objects, or assemblies of parts. Such systems typically employ computer aided design (CAD) and computer aided engineering (CAE) programs. These systems allow a user to construct, manipulate, and simulate complex three-dimensional models of objects or assemblies of objects. These CAD and CAE systems provide a model representation of objects ("modeled objects" herein) using edges or lines, in certain cases with faces. Lines, edges, faces, or polygons may be represented in various manners, e.g. non-uniform rational basis-splines (NURBS).

These CAD systems manage parts or assemblies of parts of modeled objects, which are mainly specifications of geometry. In particular, CAD files contain specifications, from which geometry is generated. From geometry, a three-dimensional CAD model or model representation is generated. Specifications, geometries, and CAD models/representations may be stored in a single CAD file or multiple CAD files. CAD systems include graphic tools for visually representing the modeled objects as represented in 3-dimensional space to designers; these tools are dedicated to the display of complex real-world objects. For example, an assembly may contain thousands of parts. A CAD system can be used to manage three-dimensional models of real-world objects, which are stored in electronic files.

The advent of CAD and CAE systems allows for a wide range of representation possibilities, such as mesh-based models, for objects. CAD models are typically approximated by mesh-based models to enable discrete numerical computation. Thus, mesh-based models may approximate, e.g., represent, one or more parts or an entire assembly. An example mesh-based model is a finite element mesh, which is a system of points called nodes that are interconnected to make a grid, referred to as a mesh. Mesh-based models may be programmed in such a way that the mesh-based model has the properties (e.g., physical, material, or other physics-based) of the underlying real-world object or objects that the mesh-based model represents. Example properties include stiffness (ratio of force to displacement), plasticity (irreversible strain), and viscosity (resistance to flow of one layer over an adjacent layer), amongst others. When a finite element mesh or other such mesh-based model as is known in the art, is programmed in such a way, it may be used to perform simulations of the real-world object that the model represents. For example, a mesh-based model may be used to represent the interior cavity of a vehicle, the acoustic fluid surrounding a structure, or any number of real-world objects. Moreover, CAD and CAE systems, along with mesh-based models, can be utilized to simulate engineering systems, such as real-world physical systems, e.g., cars, planes, buildings, and bridges, amongst other examples. Further, CAE systems can be employed to simulate any variety and combination of behaviors of these physics based systems, such as noise and vibration.

SUMMARY

Embodiments of the invention generally relate to the field of computer programs and systems and specifically to the field of product design and simulation. As described above, computer-aided systems exist for simulating real-world physical objects, and more particularly simulating physics-based characteristics of the objects. However, these existing systems can benefit from processes that improve speed and efficiency. Improving the speed and efficiency of simulation functionality improves real-world object design and, likewise, improves real-world objects that are manufactured based upon these improved designs. Embodiments of the present invention provide such functionality.

One such example embodiment provides a computer-implemented method for performing a computer-based simulation of a real-world object. In particular, the method begins by obtaining a mesh-based model representing a real-world object. The mesh-based model is composed of a plurality of mesh elements each having geometric properties. To continue, the method performs a simulation of the physical behavior (physics based characteristics) of the real-world object using the mesh-based model. Performing the simulation includes modifying, i.e., correcting, as a function of the mesh geometric properties, material properties (measurements or amounts thereof) used to determine the physical behavior for at least one mesh element of the plurality of mesh elements of the model. In other words, according to an embodiment, measurements (i.e., amounts or levels) of material properties of a mesh element are changed based upon geometric properties of the mesh element to correct errors/inaccuracies in the simulation. According to an embodiment, the modification of the material properties corrects for discretization errors that result from discretizing the model of the real-world object, i.e., representing the real-world object using a mesh-based model.

From the results or using the results of the performed simulation, the method automatically identifies a design change of the real-world object. The method may also include automatically modifying the mesh-based model of the real-world object to correspond to the identified design change. Another embodiment may iterate: (i) performing the simulation, (ii) identifying the design change, and (iii) modifying the model to correspond with the design change, until an optimized design of the real-world object is determined. In this way, embodiments may automatically generate improved designs of real-world objects.

The mesh-based model employed in embodiments may be any such mesh-based model known in the art. For instance, in an embodiment, the mesh-based model is: a finite element model, a finite volume model, or a finite difference method model. Similarly, the simulation performed in embodiments may be any such computer-based simulation known in the art, such as a finite element simulation, finite volume simulation or finite difference simulation.

Embodiments may be used to compute physical behavior or physics based behavior of the real-world object in any variety of domains. For instance, in an embodiment, performing the simulation includes computing physical behavior in at least one of: a fluid domain, a structure domain, and an electromagnetic domain. Likewise, embodiments may be used to simulate any real-world objects. According to an embodiment, the real-world object is an automobile, a vehicle, an airplane, a boat, a water vessel, a jet-engine, a building, a civil engineering structure, a reservoir, or a human. Examples for which embodiments may be used to simulate are as varied as the virtual earthquake testing of a pre-construction model Beijing Olympic stadium, or the virtual testing of a clinical procedure of inserting a model of a medical device into a model of the human heart. In another embodiment, the real-world object is a thin wall metal shell.

Yet another embodiment simulates car batteries, i.e., cells, represented by mesh based models comprising volume elements.

According to an example embodiment, modifying the material properties (measurements thereof) as a function of the mesh geometric properties, e.g., geometric properties of mesh elements, includes modifying a data curve (which represents an analytical relationship) dictating physical behavior given the geometric properties of the mesh. In an embodiment, the physical behavior (material properties) is plastic compression and metal folding, and the data curve is a stress-strain curve formed by empirical data or from a very fine mesh based model, e.g., a representative elementary volume (RVE) finite element model. In one such example embodiment, in performing the simulation, the stress-strain curve (data values thereof) is modified for periods of time in which the real-world object is undergoing the plastic compression behavior, and the stress-strain curve is not modified for periods of time in which the real-world object is not undergoing the plastic compression behavior. In another embodiment, the modified stress-strain curve (data values thereof) is applied to shell elements of the mesh-based model when performing the simulation.

Another embodiment determines the modifications used in modifying the material properties (measurements and corresponding data curve) as a function of the geometric properties of the mesh. Such an example embodiment first, performs a plurality of simulations using a plurality of mesh-based models with varying geometric properties and second, identifies the material property modifications using a machine learning analysis of results from the plurality of simulations.

According to an embodiment, the mesh geometric properties include at least one of a shell thickness and a mesh metric. Example mesh metrics include a vertex size, a mesh edge size, a mesh face size, a mesh polygon size, mesh aspect ratios, and a mesh surface size, amongst other examples.

In another embodiment, the real-world object is subject to fluid flow. In such an embodiment, performing the simulation may determine behavior of the real-world object while subject to the fluid flow. Further in yet another embodiment, modifying the material properties (measurement values or amounts) as a function of the mesh geometric properties includes modifying a value dictating material property/physical behavior given the geometric properties. According to an embodiment, the physical behavior is fluid flow and the value dictating material property/physical behavior given the mesh geometric properties is viscosity.

Another embodiment is directed to a system for performing a computer-based simulation. The system includes a processor and a memory with computer code instructions stored thereon that cause the system to perform the simulation as described herein. In an example embodiment, the system is configured to obtain a mesh-based model representing a real-world object, where the mesh-based model is composed of a plurality of mesh elements each having geometric properties. Using the mesh-based model, the system performs a simulation of physical behavior of the real-world object which includes, for at least one mesh element of the plurality, modifying, as a function of the mesh geometric properties, material properties (measurements or amounts thereof) used to determine the physical behavior (physics-based characteristics).

Another embodiment of the present invention is directed to a cloud computing implementation for performing a computer-based simulation. Such an embodiment is directed to a computer program product executed by a server in communication across a network with one or more clients, where the computer program product comprises a computer readable medium. In such an embodiment, the computer readable medium comprises program instructions which, when executed by a processor, causes the processor to obtain a mesh-based model representing a real-world object, where the mesh-based model is composed of a plurality of mesh elements each having geometric properties. Further, the executed computer program product (program instructions thereon) causes the server to perform a simulation of physical behavior of the real-world object using the mesh-based model, which includes, for at least one mesh element of the plurality, modifying, as a function of the mesh geometric properties, material properties (measurements or amounts thereof) used to determine the physical behavior (physics-based characteristics).

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 11 is an example dataset used in a machine learning method, such as the method depicted in FIG. 10, and results from such a machine learning method.

DETAILED DESCRIPTION

A description of example embodiments follows.

The teachings of all patents, published applications, and references cited herein are incorporated by reference in their entirety.

As described above, existing computer-based simulation methods can benefit from functionality to improve speed and efficiency while still maintaining the accuracy of the simulations. Currently, computer-based simulation of real-world objects is generally performed using mesh-based models. These mesh-based models represent a real-world object using a system of points called nodes which are interconnected to make a grid, referred to as a mesh. As such, the real-world object is represented in a discretized form. Discretizing the real-world object to perform computer-based simulations introduces errors. Estimates of the mesh discretization error can be obtained by techniques such as Richardson extrapolation. For numerical techniques, i.e., mesh-based simulation methods, error correction is implemented by increasing the mesh refinement, i.e., utilizing models with a finer mesh. However, employing finer mesh-based models increases the processing time required to perform the simulations, often leading to prohibitive simulation costs.

Figure 1:
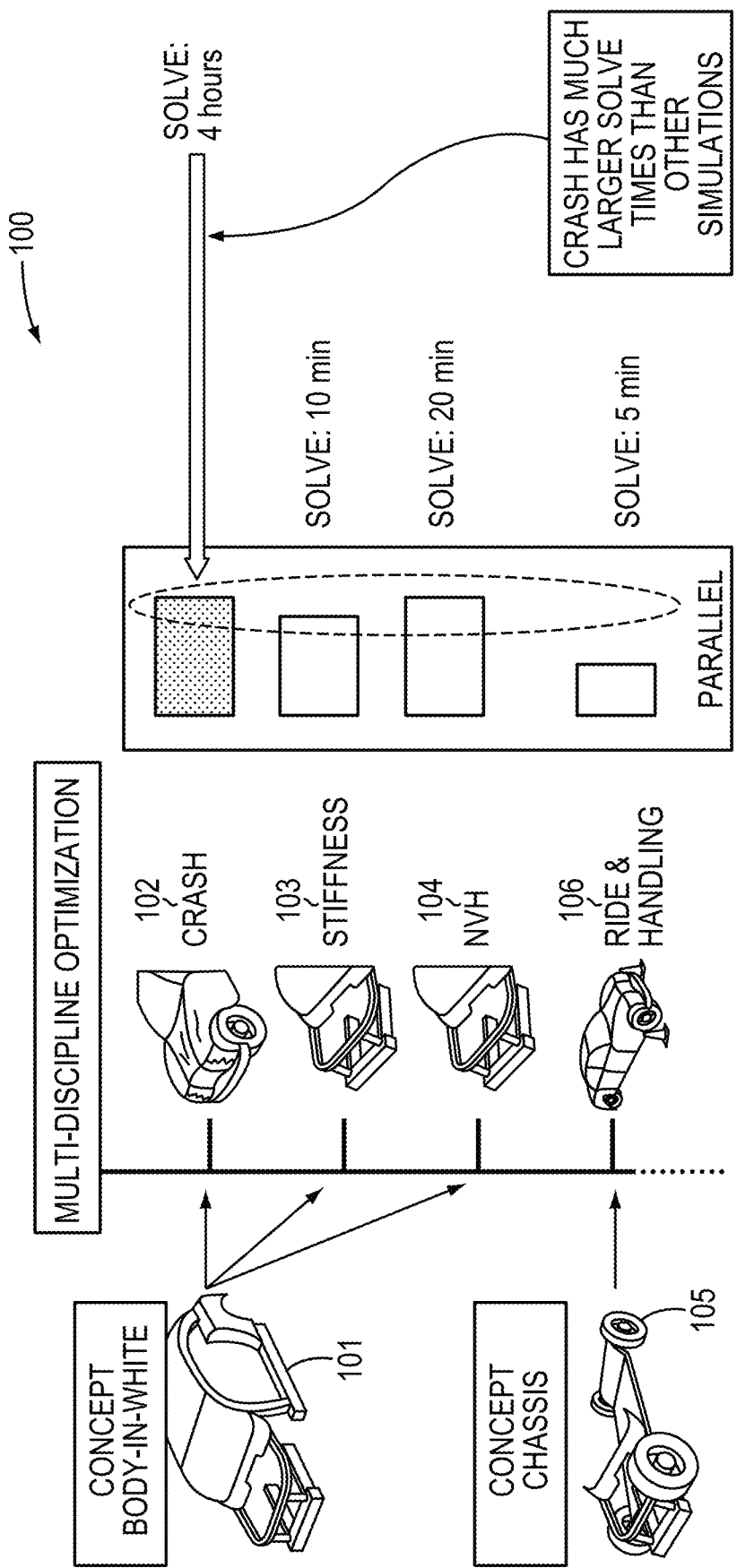
FIG. 1 is a block diagram of an engineering design optimization method in which embodiments may be implemented.

For instance, FIG. 1 illustrates a multi-discipline optimization simulation 100 where the simulation is prohibitively time consuming. The simulation 100 utilizes a mesh based model 101 of a car to perform a crash simulation 102, stiffness simulation 103, and noise, vibration, and harshness (NVH) simulation 104 in parallel. A model 105 of the car chassis is also used in a ride and handling simulation 106 that is performed in parallel with the simulations 102, 103, and 104. In the optimization simulation 100, the stiffness simulation 103 is solved in approximately 10 minutes, the NVH simulation 104 is solved in approximately 20 minutes, and the ride and handling simulation is solved in approximately 5 minutes. In contrast, the crash simulation 102 takes approximately 4 hours to be solved.

"Optimizing High Fidelity Crash & Safety Simulation Performance," available at https://www.cray.com/sites/default/files/Altair-Cray-RADIOSS-Crash-Safety.pdf (hereinafter Altair-Cray), describes another example of a prohibitively time consuming and computationally expensive simulation. This existing Altair-Cray simulation methodology uses 1024 core processors for 6 hours to simulate a 100 millisecond impact of a sedan. Such a simulation is very expensive in terms of both computational resources (1024 core processors) and clock time (6+ hours). Moreover, a typical crash simulation requires a mesh size of 2 mm (each individual mesh element, such as a triangulation, represents a 2 mm by 2 mm area of the real-world object) to capture the metal folding behavior and this leads to a model with millions of simulation elements. The computational resource and time costs of such a methodology make the methodology prohibitively expensive for many applications, such as the concept design simulation 100 depicted in FIG. 1. Embodiments described herein solve this problem and provide methods and systems for simulating real-world objects with greatly reduced computational time.

Benchmark testing results for the Altair-Cray simulation methodology described in "Optimizing High Fidelity Crash & Safety Simulation Performance," available at https://www.cray.com/sites/default/files/Altair-Cray-RADIOSS-Crash-Safety.pdf show the elapsed time to simulate 2 ms of a crash versus the number of processing nodes (core processors) used to perform the simulation. The Altair-Cray results show that even where 512 nodes (core processors) are used, simulating 2 ms of the crash takes 227 seconds of total processing/computation time. Further, it is noted that an entire crash is approximately 100 ms to 200 ms and thus, using an existing simulation method (the Altair-Cray methodology), even with 512 nodes (core processors), requires approximately 11,350 seconds to 22,700 seconds (3.15 hours to 6.3 hours) to simulate the entire crash.

One factor contributing to the long processing time required by the existing Altair-Cray method is the size of the mesh-based model used, 2 mm. In existing methods, typical mesh size ranges from 2 mm to 5 mm. However, other benchmarking studies, such as Marzbanrad et al., "A Numerical and experimental study on the crash behavior of the extruded aluminum crash box with elastic support," Latin American Journal of Solids and Structures, 11, pages 1329-1348 (2014), have confirmed that 2 mm mesh sizes are required for accurate modeling and this is consistent with industry processes. Further, simply increasing mesh size speeds up the simulation but, at the unacceptable cost of accuracy. Embodiments solve this problem and provide functionality that allows simulations to be performed with larger mesh base models, so as to reduce computing time, while not sacrificing accuracy of the simulation.

Hamza et al., "Design Optimization Of Vehicle Structures For Crashworthiness Using Equivalent Mechanism Approximations," ASME Design Engineering Technical Conferences and Computers and Information in Engineering Conference (September 2003), and others, have tried to reduce the computational expense of simulating real-world objects by creating equivalent crash mechanisms out of beams. However, these attempts are problematic because (i) the model can only bend at revolute joints, (ii) large deformation errors are introduced, and (iii) it is difficult to go from the equivalent design to the detailed design. As such, the Hamza approach and its variants are not good solutions for speeding up computer-based simulations.

Figure 2A:
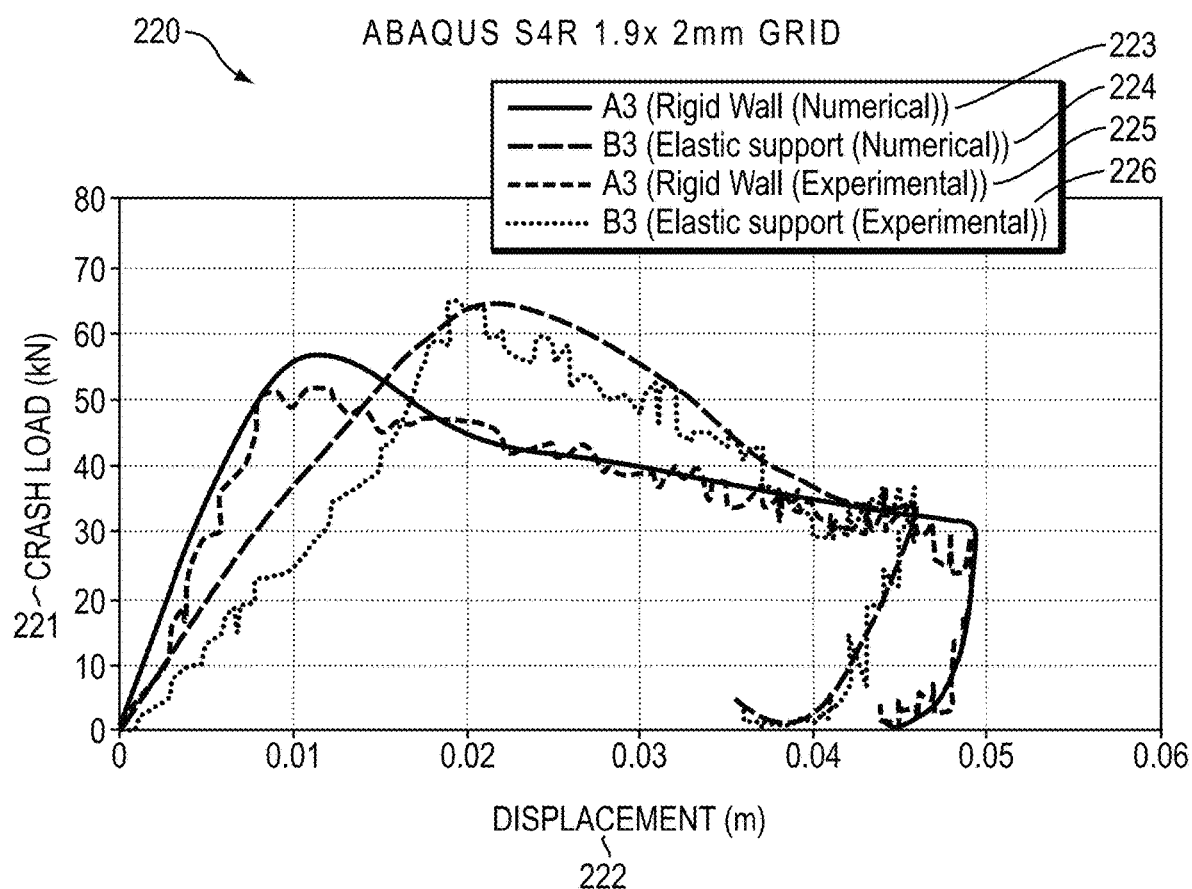
FIG. 2A is a diagram illustrating accuracy of simulations performed with existing methods.

FIG. 2A illustrates accuracy, in the plot 220, of simulations performed with existing methods. The plot 220 shows crash load 221 versus displacement 222. Crash load 221 is axial force experienced in the tube (the object being simulated) and displacement 222 refers to the axial displacement. The multiplication of a crash load 221 value (amount) and displacement 222 value (amount) defines the amount of energy absorbed in a crash. The lines 223 and 224 show numerical results of a simulation performed using an existing method and the lines 225 and 226 show experimental results from a crash experiment performed by applying a load to pieces of metal (the tubes 227 and 228 depicted in FIG. 2B).

Figure 2B:
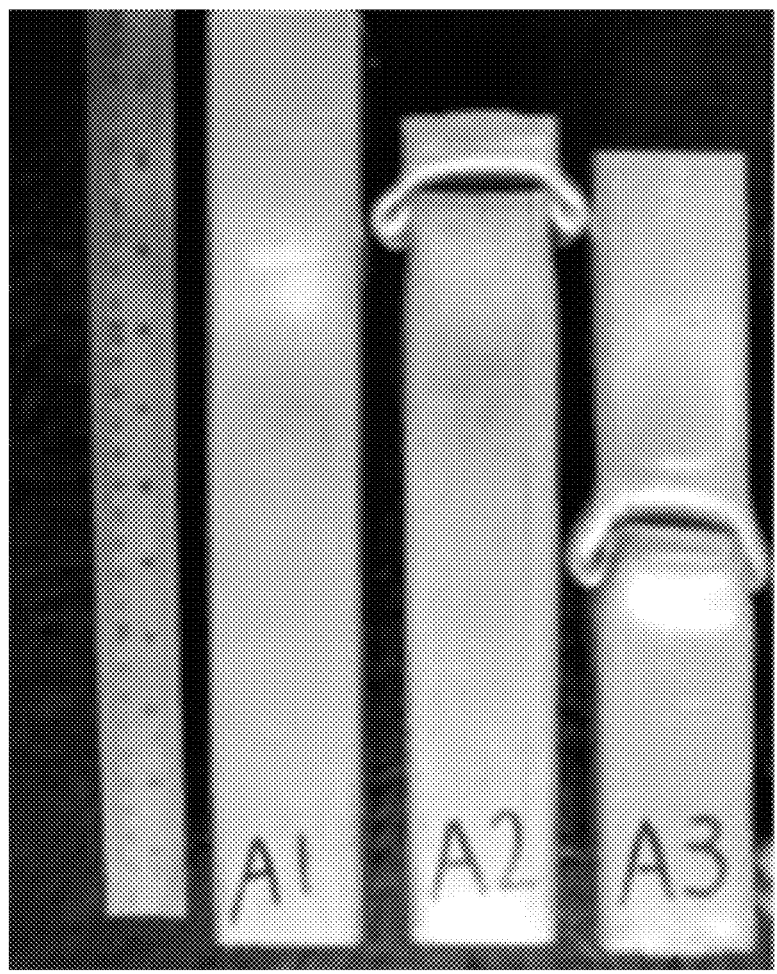
FIG. 2B depicts results of applying a force on real-world objects that may be simulated using computer-based simulation techniques.

FIG. 2B depicts real-world experimental results used to create the lines 225 and 226 shown in the plot 220. In the experiment, a force was applied to the thin walled metal tubes 227 and 228 and the resulting bending and folding in the thin walled metal tubes 227 and 228 was measured to obtain the crash results. The plot 220 shows that 2 mm mesh size is needed to obtain numerical simulation results 223 and 224 that are sufficiently similar to the real-world experimental results 225 and 226 that were observed when performing the aforementioned experiment with thin walled metal tubes 227 and 228. The 2 mm mesh size is needed for the mesh to capture the curvature of the real-world folding in order to get an accurate simulation result. This is problematic because, as described above, simulations performed with 2 mm size mesh-based models can be prohibitively computationally expensive. Furthermore, increasing mesh size introduces discretization errors that degrade accuracy. Embodiments provide a solution to these problems.

Figure 3:
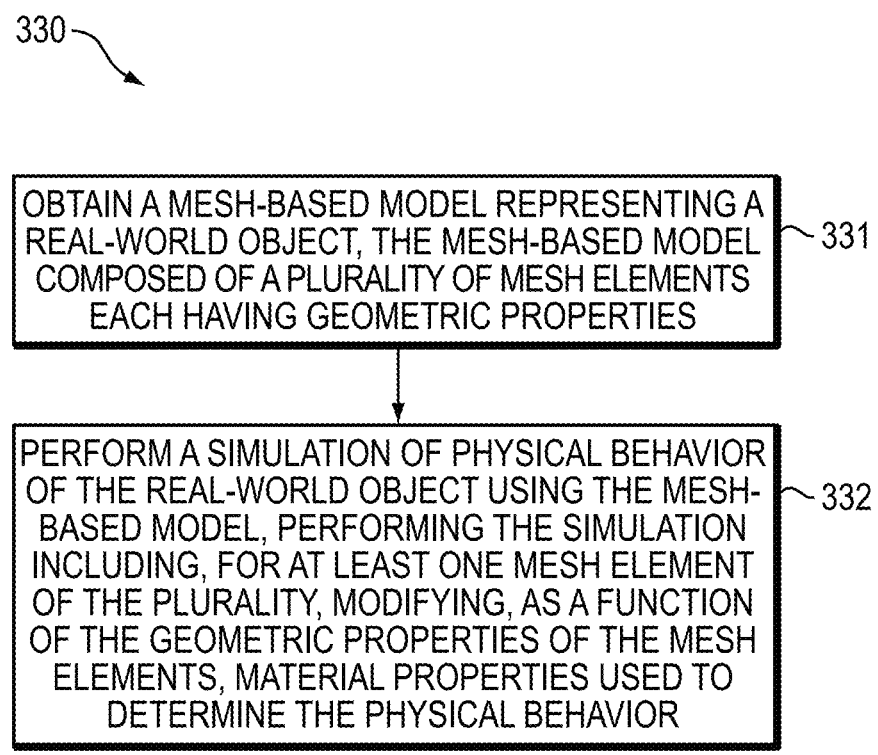
FIG. 3 is a flowchart of a method for simulating a real-world object according to an embodiment.

FIG. 3 is a flowchart of a method 330 for performing a computer-based simulation of a real-world object according to an embodiment. The method 330 may be computer implemented and performed via any combination of hardware and software as is known in the art. For example, the method 330 may be implemented via one or more processors with associated memory storing computer code instructions that cause the processor to implement steps of the method 330. The method 330 provides improved functionality for simulating real-world objects. For example, the method 330 is computationally far less expensive when compared to existing methods.

The method 330 begins at step 331 by a digital processor obtaining a mesh-based model representing a real-world object. The mesh-based model obtained at step 331 is composed of a plurality of mesh elements each having geometric properties. Because the method 330 is computer implemented, the mesh-based model may be obtained at step 331 from any point, e.g., computing or storage device, capable of communicating with the computing device implementing the method 330.

To continue, at step 332, a simulation of physical behavior (physics-based characteristics) of the real-world object is performed using the mesh-based model. A processor performs the simulation at step 332 and includes modifying, as a function of the mesh geometric properties, measurements of material properties used to determine the physical behavior for at least one mesh element of the plurality of mesh elements. In other words, according to an embodiment, the processor at step 332 modifies amounts or levels of a subject material property of a mesh element based upon geometric properties of the mesh element so as to account for errors/inaccuracies in the simulation. In an embodiment, the mesh elements are the individual elements made of nodes and edges that form a mesh based model.

In the case of the thin walled tubes 227 and 228 of FIG. 2B, the mesh elements are roughly square and model the thickness to a set of virtual integration points. As the mesh elements increase in size, a larger force is required to perform the increased internal mesh element plastic deformation representing the folds. In an embodiment, this increased force is accounted for by reducing material plastic stiffness a priori. For instance, in an embodiment, the modifying in step 332 uses a determined relationship between a mesh geometric property and a material property to modify the material property measurement values (amounts) during the simulation without a priori knowledge of the correct solution, i.e., without knowledge of the expected result of the physics-based behavior being determined.

An embodiment determines this relationship by performing multiple simulations and performing a machine learning analysis on the results of these simulations to (1) determine how changes in geometric properties of the mesh effect the simulation results and (2) determine changes in measurements or amounts of subject material properties that can be made in the simulation to obtain the same simulation results regardless of the geometric properties of the mesh-based model. Then, in performing the simulation at step 332, these changes to material property values (measurements or amounts) are used to obtain acceptable simulation results even where mesh geometric properties are changed. Further details regarding determining relationship(s) used in embodiments are described hereinbelow.

To illustrate step 332, consider an example where the mesh-based model represents a car, and the mesh-based model and individual elements of the mesh-based model are programmed to have physical or material properties of the car they represent. In this simplified example, a given mesh element is programmed to have a material property, the plastic yield strength of steel, and the geometric property of the mesh element is its size. Given this set-up, when simulating physical behavior of the modeled car, such as a collision (compression) at step 332, the measurement values of the subject material property (the plastic yield strength) are modified based upon the size of the mesh element.

Modifying the measurements/amounts of the material properties of interest of a mesh element as a function of mesh geometric properties allows the method 330 to simulate a real-world object more efficiently and more quickly than existing methods. For instance, because material property measurements or amounts are modified as a function of mesh geometric properties, geometric properties of the mesh-based model can be used that allow the simulation to be performed more quickly while not sacrificing accuracy.

Returning to the aforementioned car example, if, for instance, a mesh size of 2 mm is needed to accurately simulate physics-based behavior of the car, a simulation of physical behavior of the car may be computationally too costly to perform. However, by changing the mesh size geometric property to, for example, 25 mm, the simulation can be performed more quickly. However, increasing the mesh size to be able to quickly perform the simulation introduces discretization errors that are unacceptable. Embodiments, such as the method 330, solve this discretization error problem by accounting for a geometric property, e.g., mesh size, by changing measurement values (amounts) of a material property, e.g., yield strength of steel. In this way, embodiments can obtain the same or similar simulation results as predecessor methods but more quickly and without sacrificing accuracy. Thus, embodiments greatly reduce the computing time needed to simulate a real-world object.

The mesh-based model employed in the method 330 may be any such mesh-based model known in the art. For instance, in an embodiment, the mesh-based model is: a finite element model, a finite volume model, or a finite difference method model. Similarly, the simulation performed at step 332 may be any such computer-based simulation known in the art, such as a finite element simulation. Further, the simulation may be performed at step 332 according to known principles, with the exception of modifying material property measurements as a function of mesh geometric properties. Moreover, the mesh geometric properties may include any geometric properties known in the art, such as shell thickness or a mesh metric. Examples of mesh metrics include vertex size, mesh area, mesh skewedness, and mesh aspect ratio, amongst other examples.

The method 330 may be used to compute physical behavior of the real-world object in any variety of domains. For instance, performing the simulation at step 332 includes computing physical (physics-based) behavior in at least one of: a fluid domain, a structure domain, and an electromagnetic domain. Further, the method 330 can be used to simulate any real-world objects known in the art, such as automobiles, airplanes, boats, jet-engines, buildings, civil engineering structures, reservoirs, humans, or a thin wall metal shell.

According to an embodiment of the method 330, modifying the measurements (amounts) of material properties as a function of the mesh geometric properties in step 332 includes modifying a data curve dictating material (physical) behavior given the geometric properties. In an example embodiment of the method 330, the physical behavior and material properties are plastic compression and metal folding, and the data curve is a stress-strain curve. In one such example embodiment, in performing the simulation, the data point values on the stress-strain curve are modified for periods of time in which the real-world object is undergoing the plastic behavior, e.g., plastic compression and/or plastic tensile behavior, and the stress-strain curve is not modified for periods of time in which the real-world object is not undergoing the plastic behavior. In another embodiment, the modified stress-strain curve (data values thereof) is applied to shell elements of the mesh-based model when performing the simulation depending on when the element is experiencing the plastic phenomena. These physics-based phenomena are extremely short in duration as the compression waves travel and reflect through the body of the object being simulated at a speed of miles per second. In response to threshold compression waves, the body of the object folds. As the folding happens, energy is being absorbed. As such, embodiments may modify measurement values (amounts) of the material properties at times or during time periods when simulating such physics-based behavior, i.e., folding/energy absorption phenomena, for which modification is needed.

It is noted that in embodiments of the method 330, regardless of the physical behavior and material properties, the simulation performed at step 332 may only modify the material properties (measurement values thereof) when needed, such as when, amongst other examples, an error occurs with a particular behavior type. The type of physical behavior and timing for when correction is needed may be determined in an embodiment and/or may be based on a pre-determined relationship, i.e., a relationship determined using the method described hereinbelow with reference to FIG. 10. For example, in an embodiment, the modification applied at step 332 follows a data curve and the point on the curve (the state/modification to be applied at a moment in time) is determined by the physical phenomena calculation over time. For instance, in an embodiment, a curve, e.g., the curve 907 in FIG. 9, defines the correction and the point on the curve to use, i.e., the correction to be applied, is determined by the physical calculation for every element as a function of the amount of plastic deformation for every time step. In an embodiment, the correction can be looked-up from results of the method of FIG. 10. Further, when to correct may be determined automatically or may be set by a user. For example, in an embodiment, when to correct may be determined automatically for each mesh element based on material properties of the mesh element, which may be set by a user.

As noted above, in an embodiment of the method 330, the modifying in step 332 uses a determined relationship between the mesh geometric property and the material property to modify the material property during the simulation. An embodiment of the method 330 determines this relationship. For instance, an embodiment performs a plurality of simulations using a plurality of mesh-based models having varying geometric properties and identifies material property modifications using a machine learning analysis of results from the plurality of simulations.

In an embodiment of the method 330, the real-world object is subject to fluid flow. Further in yet another embodiment, modifying the material properties as a function of the mesh geometric properties includes modifying a value dictating material (physical) behavior given the geometric properties. In such an example embodiment, the physical behavior is fluid flow and the value dictating material behavior given the geometric properties is viscosity.

From the results or using the results of the simulation from step 332, another embodiment of the method 330 automatically identifies a design change of the real-world object based on results of the performed simulation. This design change may be identified by identifying a point of failure, for example, a failure due to excessive plastic deformation. Based upon an identified point of failure, changes to the object's geometry may be identified and implemented to prevent this failure from occurring. Changes may include modifications to the global structural layout (geometry including shell thickness) in order to reduce excessive deformation without increasing acceleration of forces on the object or contents of the object, e.g., occupants. Such an embodiment may also include automatically modifying the mesh-based model or a geometry model (for instance, by changing the shell thicknesses) on which the mesh-based model of the real-world object is based, to correspond to the identified design change. Further still, an embodiment of the method 330 may iterate performing the simulation at step 332, identifying the design change, and modifying the model to correspond with the design change until an optimized design of the real-world object is determined. In this way, such an embodiment automatically generates an improved design of the real-world object.

Hereinbelow, example embodiments and results are described in relation to a car collision. However, it is noted that embodiments are not so limited and the methods and systems described herein may be used to simulate any variety of real-world objects undergoing any variety of behavior.

As described above, current methods for resolving physical behavior of a real-world object, such as metal plastic folding, require small mesh sizes. In the example of automatic crash safety, such mesh sizes are generally associated with (or otherwise correspond to) the thicknesses of sheet metal material (1 mm to 6 mm). Using such small mesh sizes results in large models that take many hours to simulate. As such, these existing methods cannot be used for numerous applications, such as conceptual layout of cars. Efforts have been made to create equivalent beam structures to model the objects, but such approaches do not accurately resolve the physics, particularly not at the locations where there are shell joints. These existing solutions are also problematic because there is no one-to-one relationship between the beam elements and the complex shell layout. A complex geometry shell fails due to the plastic wrinkling or folding of the shell while the beam deforms at its node points (like the stick figure). This is problematic because there is no direct geometric mapping between a stick figure model and a shell model.

Embodiments of the present invention solve these problems. For instance, an embodiment of the present invention may change the plastic deformation physics during an explicit simulation for thin walled shell elements (1-7 mm) when in the plastic (compression) folding state. Such an implementation of an embodiment corrects the material property (plastic deformation) for the mesh element when determining the physics-based behavior (compression) of the mesh element. In such an embodiment, the plastic compression stress-strain material curve is modified as a function of strain, thickness of the shell, and the mesh size. In this way, the material property measurements or point values as represented by a graphed curve (plastic compression stress-strain curve) are changed as a function of mesh geometric properties (thickness of the shell and mesh size). In such an embodiment, this allows mesh-based models to be used that are far larger, approximately 15-40 mm, than the meshes currently needed (2-5 mm) to simulate a crash. It is noted that max mesh size, e.g., 40 mm, may be a function of the simulation being performed or the object being simulated and, thus, other embodiments may use larger meshes than 40 mm. Through such an implementation, the accuracy in terms of deformations and accelerations for the 25 mm corrected coarse mesh is similar to a 5 mm uncorrected mesh and the speedup is approximately 25× or better. In this way, embodiments solve the problem of accurately and quickly performing computer-based simulations and greatly reduce computing time to perform such simulations.

Figure 4:
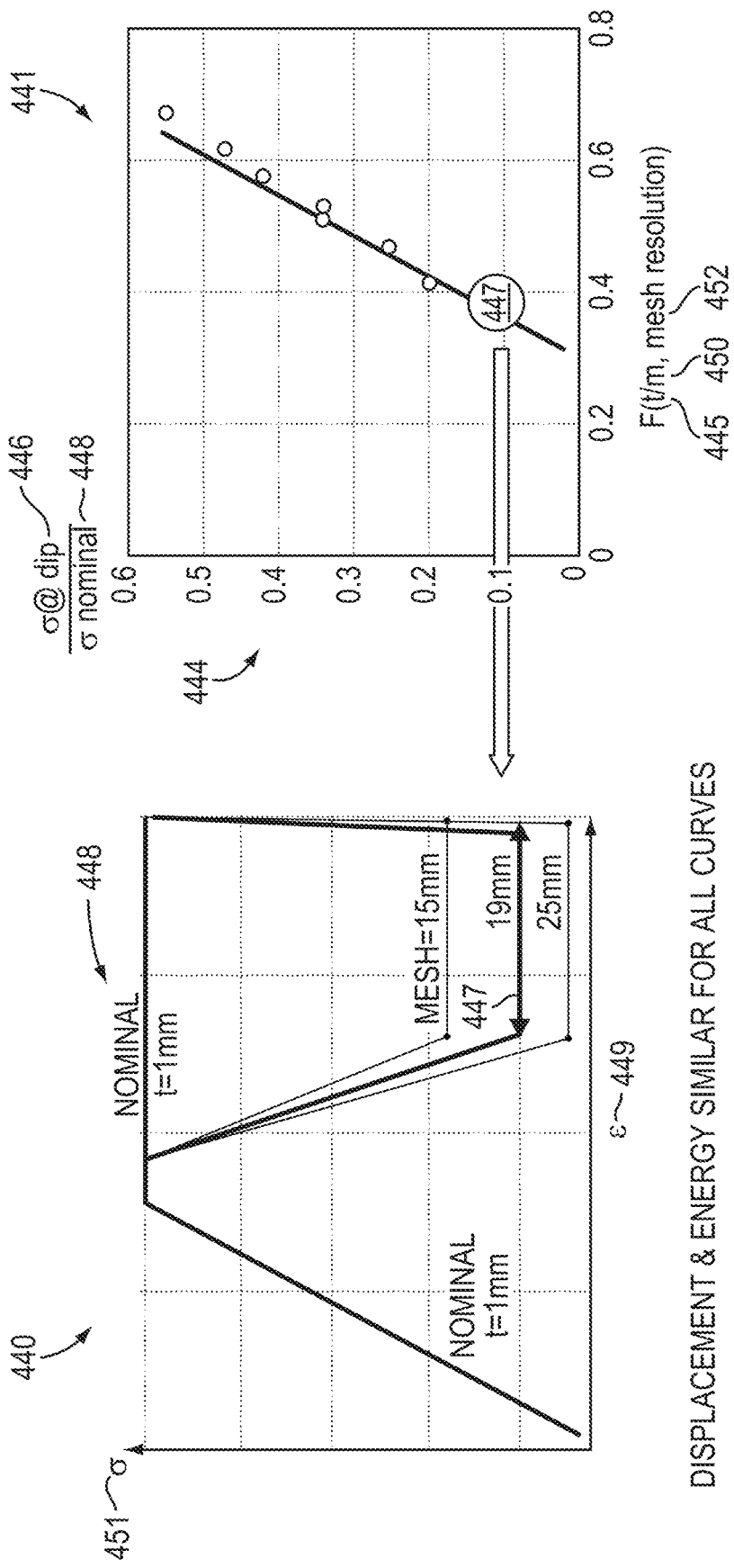
FIG. 4 is a diagram illustrating a relationship between physical behavior (physics-based characteristics) and geometric properties of mesh elements that may be employed in embodiments.

FIG. 4 is a diagram illustrating a relationship between physical behavior (physics-based characteristics) and geometric properties of mesh elements that may be employed in embodiments. FIG. 4 includes the plot 440 which shows the material stress σ 451 versus strain ε 449 curvature for shell thickness 1 mm and various mesh element sizes, and the plot 441 which shows the value of correction "dip" 446 in the material stress versus a function F of material thickness t 445, element size m 450, and mesh resolution 452. The mesh resolution 452 is determined by the number of elements across the component geometry in the crash direction. The thickness 445, element size 450, and mesh resolution 452 are known after meshing and before the solving starts. Embodiments can use these corrections in performing a simulation. The physical behavior-mesh geometries relationship (and thus percent correct 444) depicted in FIG. 4 holds for variations in the geometry and variations in the type of material, as well as variations in the impact loads and boundary conditions. For example, for a given shell thickness t, mesh size m, and mesh resolution (number of elements in the direction of crash) a embodiment can determine a ratio of plastic yield stress at the dip 447 as compared to the nominal value of the yield stress 448.

The corrections shown in the plot 441 can be employed to modify measurement values of material properties, e.g., plastic deformation physics, of mesh elements during a simulation when in the plastic (compression) folding state. In such an embodiment, the plastic compression stress-strain material curve (data points thereof) is corrected as a function of strain, thickness of the shell, and the mesh size. In such an example implementation, the correction is applied to shell elements in explicit simulations. This allows the simulation to be performed using meshes that are far larger (25 mm) than the meshes currently needed (2-5 mm) to simulate crash behavior. By allowing larger mesh sizes to be used, embodiment greatly reduce computing time for performing computer base simulations of real-world objects without comprising accuracy of the simulations.

In an embodiment, the physical behavior-mesh geometries relationship depicted in FIG. 4 is determined using design of experiments, i.e., a systematic method to determine the relationship between factors on the basis of many numerical simulations, and machine learning with dimensional reduction to simplify the relationship between the factors. Such an embodiment performs multiple simulations using mesh-based models with varying mesh geometric properties. In turn, a machine learning analysis is performed on the results of these simulations to determine the relationships between material properties and mesh geometric properties, and the determined relationships are used to determine the corrections. Further details regarding determining the corrections and the machine learning analysis are described hereinbelow in relation to FIGS. 10-11.

Figure 5:
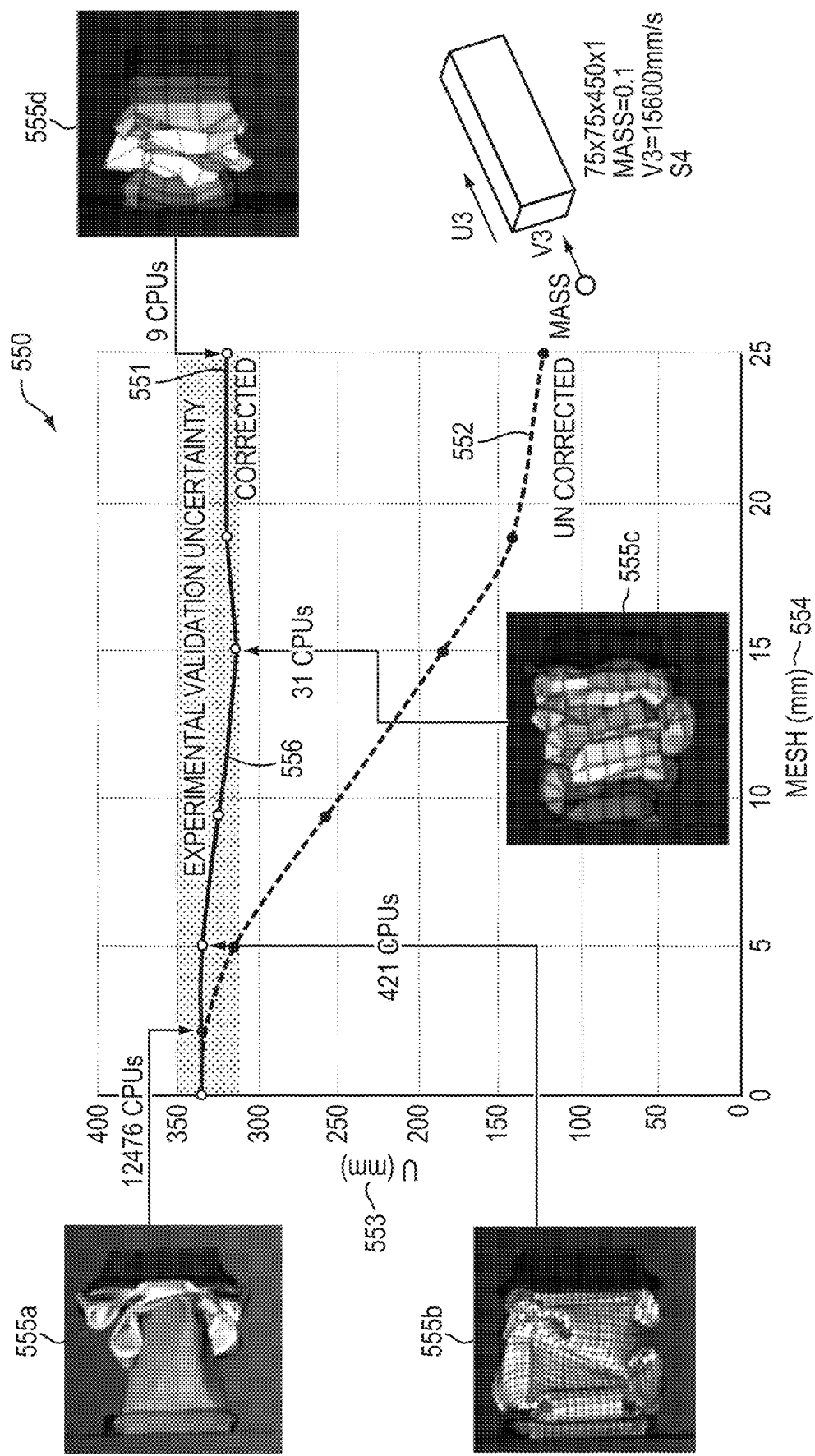
FIG. 5 is a plot comparing simulation results of an embodiment with simulation results from an existing method and depicting models used to obtain the results.

FIG. 5 shows a plot 550 comparing simulation results 551 produced according to an embodiment of the present invention with simulation results 552 produced using an existing simulation methodology. The plot 550 shows displacement simulation results 553 versus the size of the mesh 554 used to determine the displacement simulation results 553. The results 551 and 552 were generated using the mesh based models 555a (2 mm mesh), 555b (5 mm mesh), 555c (15 mm mesh) and 555d (25 mm mesh). The plot 550 shows that when mesh size is small (using the mesh of model 555a) the simulation results (551) generated using an embodiment and the results (552) generated using an existing method are similar. However, as mesh size increases, discretization error increases and the results 551 generated using an embodiment and the results 552 generated using the existing method diverge. In the plot 550, the results 551 and 552 diverge as early as at the 3 mm mesh size and the divergence is substantial by a mesh size of 5 mm (model 555b). The plot 550 shows that by modifying material properties as a function of mesh geometric properties according to the principles described herein, embodiments correct for the discretization error introduced by using larger meshes. The plot 550 also shows the uncertainty range 556 which is determined by variations in experimental results for identical conditions. Results better than this uncertainty range 556 are likely not significant. As such, embodiments can determine simulation results more quickly without compromising simulation accuracy in terms of forces experienced, energy absorbed, and overall deformations. It is noted that in an embodiment, the detailed fold geometry may not converge to a steady state. This is likely a result of simulating complex physical phenomena. For design purposes, however, the detailed shape of the folds is secondary to the prediction of forces and displacements.

Figure 6:
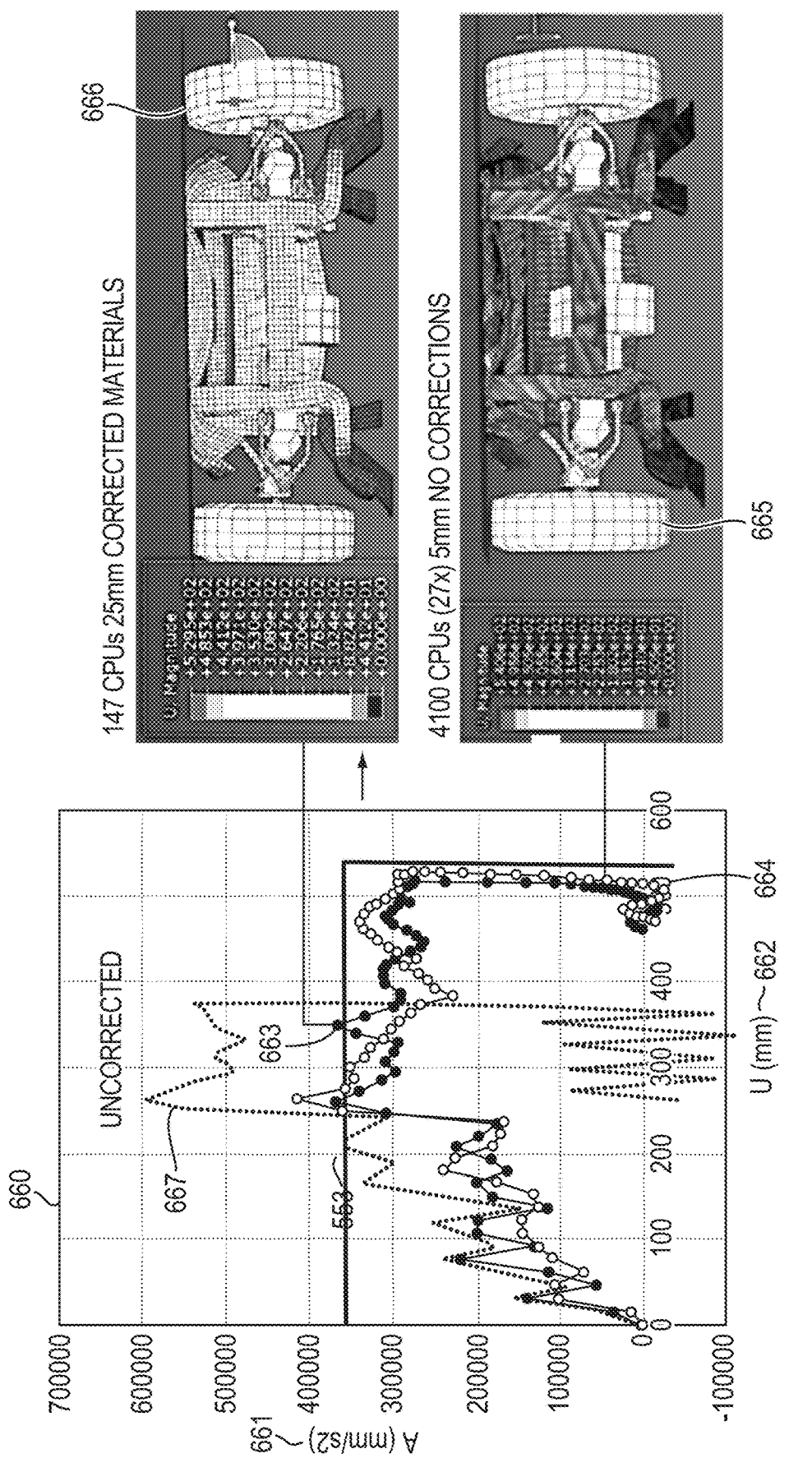
FIG. 6 depicts a plot comparing simulation results obtained using an embodiment with simulation results generated using an existing methodology and depicts models of a vehicle used in the simulations.

FIG. 6 is a plot 660 comparing simulation results generated using an embodiment of the present invention with simulation results generated using an existing methodology. The plot 660 shows acceleration 661 versus displacement 662 of a steel tube frontal car crash zone during a frontal wall collision. It is noted that the description below only references the steel tube construction mesh. FIG. 6 also shows the electro motor, drive train, and frontal wheels, of the models 666 and 665, which do not deform in the impact. The results 664 in the plot 660 were generated using a conventional 5 mm mesh-based model 665 without modifying the material properties (measurement values thereof). The results 663 were generated using principles described herein, i.e., modifying material property measurements (amounts or levels) as a function of mesh geometric properties, for a 25 mm mesh model 666. The plot 660 shows that the results 663 and 664 are similar while the results 663 were generated using a model 666 with much larger mesh elements. As such, the plot 660 shows that embodiments correct for discretization errors and allow simulations to be performed more efficiently than existing methods. As shown in FIG. 6, by employing the functionality described herein, the computational time for performing the simulation was reduced from 4100 CPU seconds (the results 664) to 147 CPU seconds (the results 663). As such, embodiments are suitable for numerous applications, such as interactive design. The plot 660 also shows the results 667, which are what the results for the model 666 would have been without the discretization error corrections. Here the simulation would have generated a result indicating that the car would hit the wall with 50% higher force and 30% less deformation. Based on these results 667, the simulation would have generated a result where the car would bounce off the wall instead of absorbing the impact. As such the effects of the present method are quite substantial.

Figure 7:
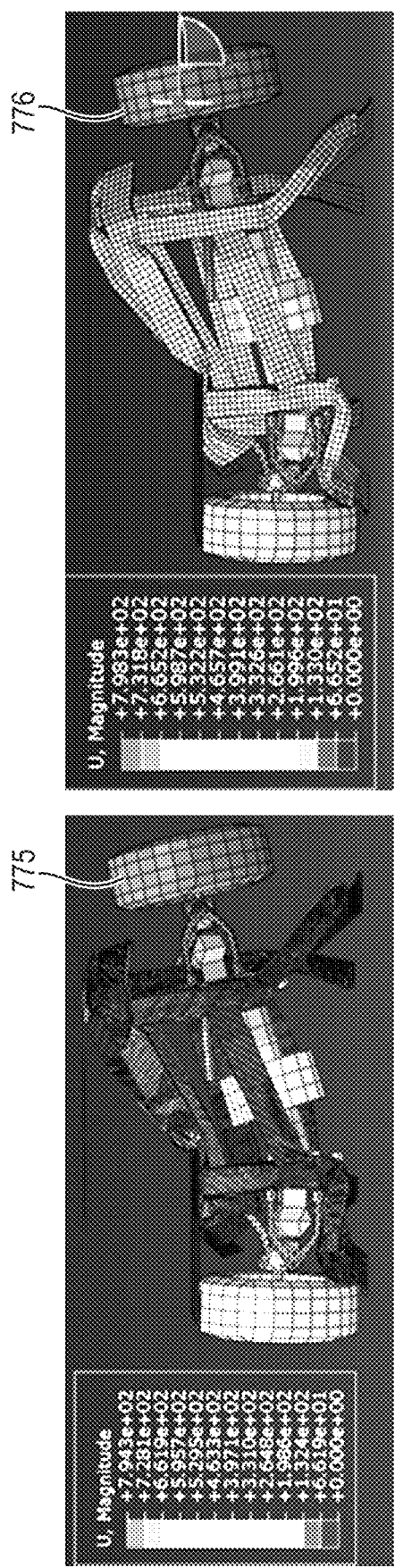
FIG. 7 illustrates models of real-world world objects and physical behavior determined by performing simulations using the models.
Figure 7:
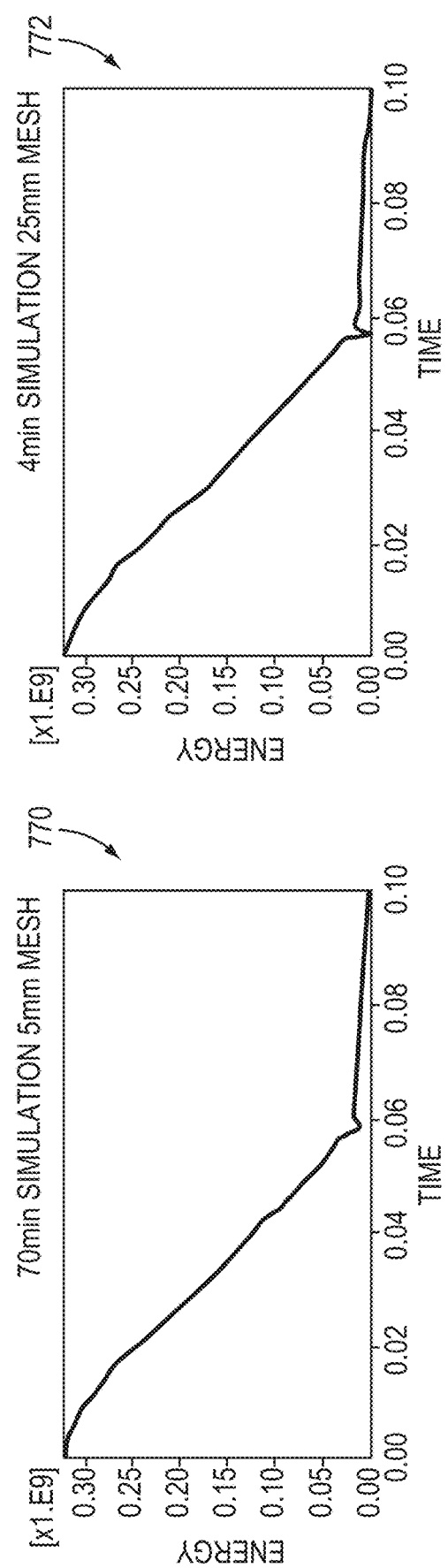

FIG. 7 illustrates simulation results 770 generated using the model 775 and simulation results 772 generated using the model 776. Here model 775 is the same pre-impact model as the model 665 described hereinabove in relation to FIG. 6, and model 776 is the same model as the model 666 described hereinabove in relation to FIG. 6. There is no change except the type of impact is changed to partial overlap, which means the car hitting a corner of a wall instead of the frontal wall is being simulated. The results 770 were generated using the model 775 which has 5 mm size mesh elements and the simulation was performed using an existing simulation method known in the art. The results 770 generated using the model 775 took 70 minutes to determine. In contrast, the results 772 were generated using the model 776 which has 25 mm size mesh elements and the simulation was performed using principles of embodiments of the present invention described herein, e.g., the method 330. The results 772 generated using the model 776 and a method that modifies measurement levels of material properties as a function of mesh size were determined in 4 minutes. Further, it can be seen in the plots 770 and 772 that the simulation results of the energy absorption as a function of time were very similar while the simulation results 772 were generated significantly faster than the results 770.

Figure 8A:
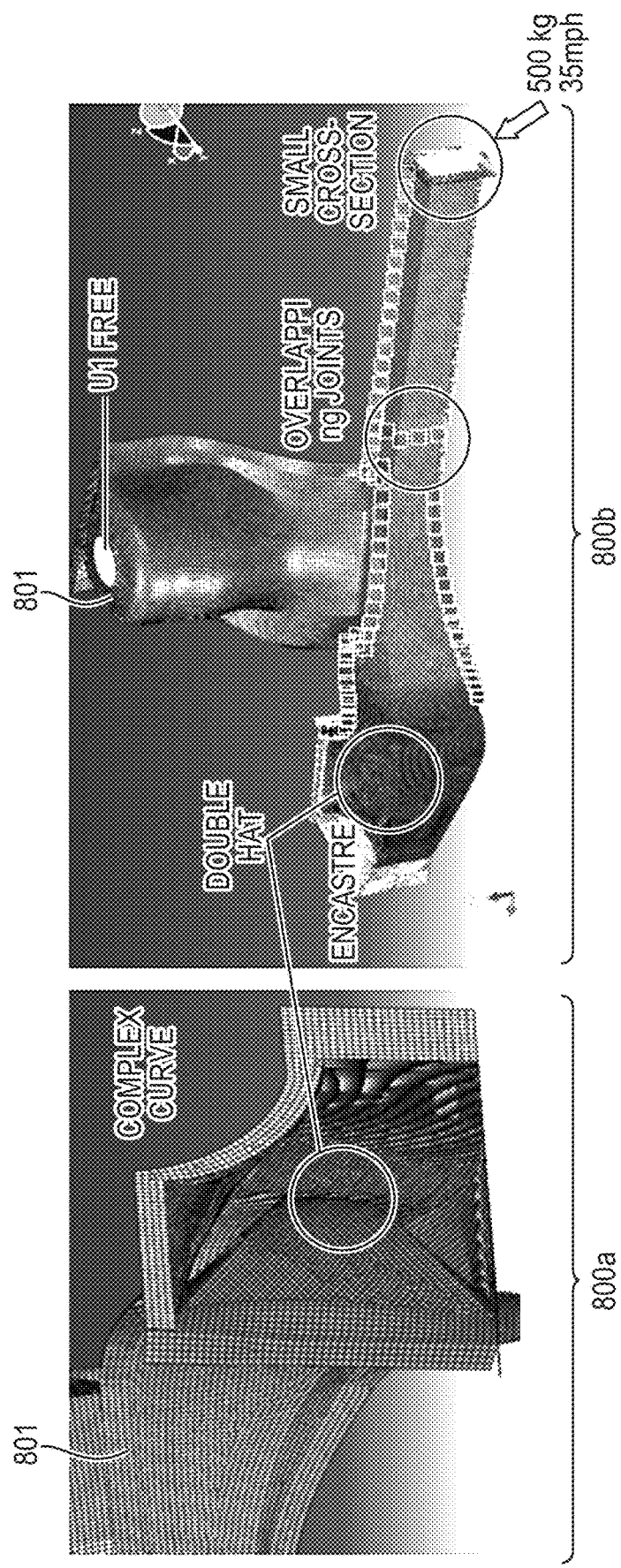
FIG. 8A depicts a mesh-based model that may be simulated using embodiments.

FIG. 8A shows two views 800a and 800b of the model 801 of a complex automotive S-beam and shock tower with overlapping riveted shells hit by a mass of 500 kg at 35 mph. Such S-beam constructions are notoriously difficult to simulate due to their instable collapse modes.

Figure 8B:
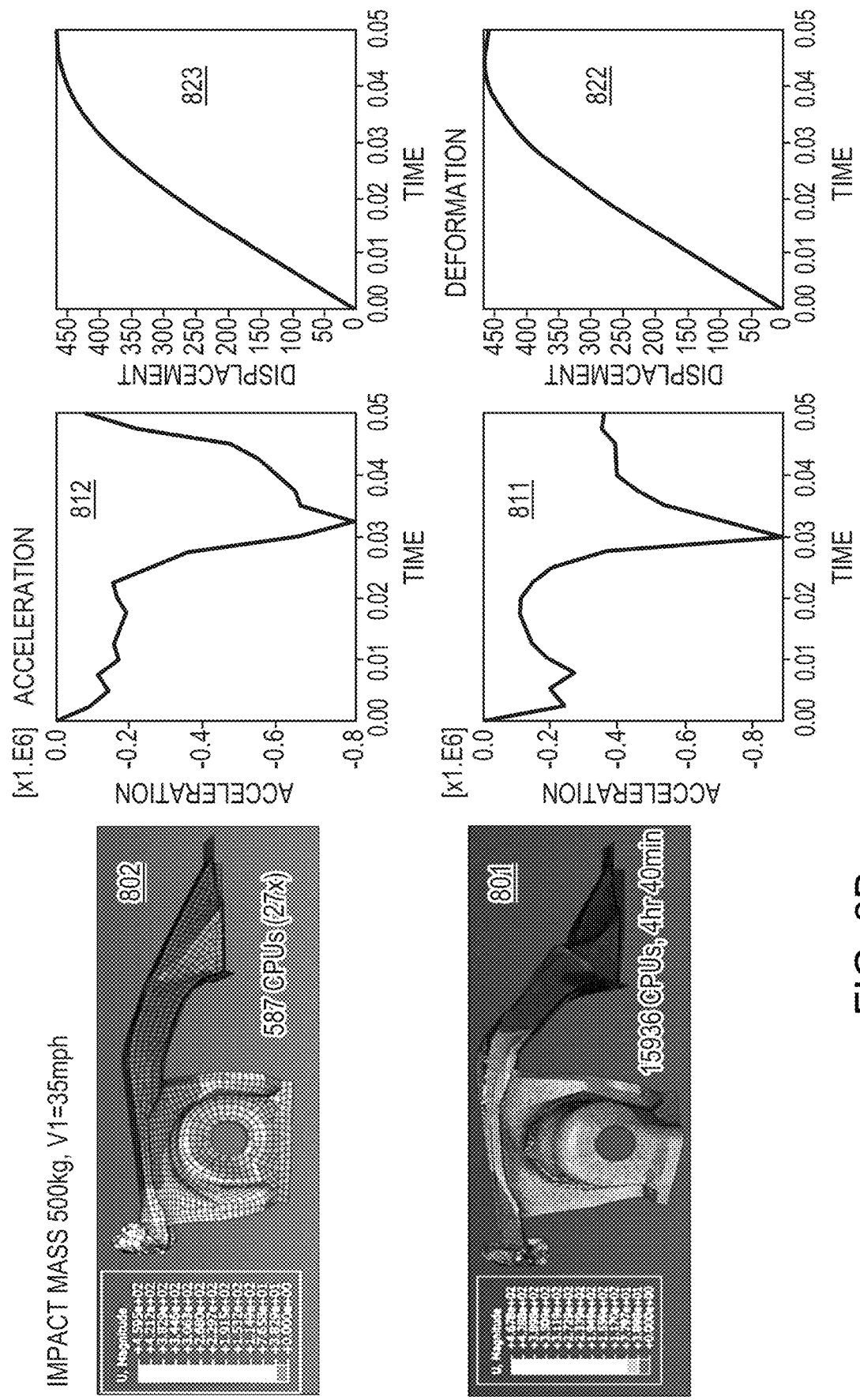
FIG. 8B compares models and simulation results generated using the model depicted in FIG. 8A and a model similar to the model in FIG. 8A, but with varied geometric properties.

FIG. 8B compares simulation results generated using the model 801 and a corrected coarse mesh model 802. The model 801 has 5 mm mesh elements while the model 802 has 25 mm mesh elements with a priori modifications to material properties as described herein. The plot 811 shows the acceleration of the mass as it hits the front of the beam for the uncorrected 5 mm model 801, whereas the plot 812 shows acceleration of the mass as it hits the front of the beam for the corrected 25 mm model 802. The plot 822 shows the axial deformation of the s-beam for the uncorrected 5 mm model 801, whereas the plot 823 shows the axial deformation of the s-beam for the corrected 25 mm model 802. All results 811, 812, 822, and 823 are substantially similar and thus, the results showing that embodiments can correct discretization errors irrespective of detailed geometry, assembly method, and types of materials.

There are multiple ways to implement embodiments of the present invention so as to perform simulations where material properties used to determine physical behavior of a real-world object are modified (level adjusted) as a function of mesh geometric properties. One such way to implement this functionality is to leverage existing mechanisms in simulation solvers, e.g., Abaqus FEA, to introduce material softening using the stress-strain curve as a function of the element size, thickness, and stress state (tension vs compression).

Figure 9:
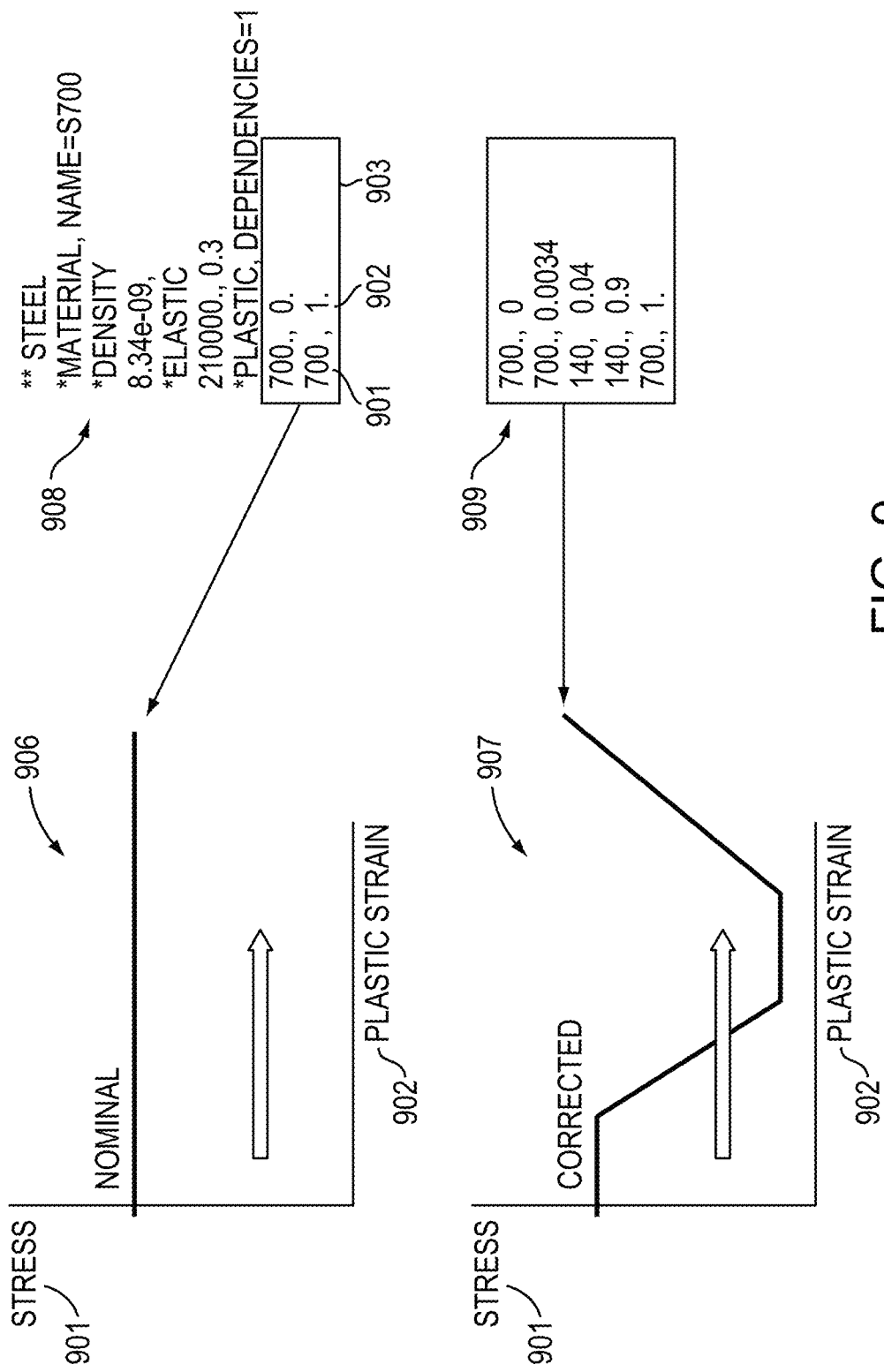
FIG. 9 depicts an implementation for correcting material properties according to an embodiment.

FIG. 9 shows in the plots 906 and 907 how the material behavior plastic stress strain curve of stress 901 versus strain 902 is changed for nominal, i.e., uncorrected, (906) versus corrected (907) to implement modifications of material property levels according to an embodiment. The uncorrected 906 material behavior is represented in the FEA model as a table 908. The corrected 907 material curve is represented in the FEA model as a table 909. The specific shape of the stress 901 versus plastic strain 902 depends on the mesh geometry, the nominal (e.g. unchanged) material properties table, the geometric thickness, and the number of mesh elements in the direction of the behavior being simulated, e.g., crash, for a given n-component geometry. Embodiments of the present invention may be implemented by modifying the material curves 906 to material curve 907 as depicted in FIG. 9.

Another way to implement embodiments is using an explicit user subroutine. Normally FEA codes do not distinguish between compression or tension for isentropic materials. An embodiment modifies the FEA source code using a subroutine, e.g., VUSFLD (an explicit Abaqus subroutine field). In such an embodiment, the subroutine computes the field value, e.g., the value 903, so as to modify the material property measurement value or level by using a modified curve during the simulation. The curve can spring back from compression to tension in a fraction of a millisecond during a simulation, e.g., automotive crash. Another embodiment can further enhance the subroutine by automatically modifying the curve, e.g., the stress versus plastic strain curve, as a function of tension and compression, for each mesh element in the simulation as a function of its nominal material properties, e.g., the properties 908, the shell geometry, and the thickness of the shell. An example of the field subroutine VUSFLD is below.

```
File Edit Format View Help
              subroutine vusdfld(
    c     Read only -
         *      nblock, nstatev, nfieldv, nprops, ndir, nshr,
         *      jElemUid, kIntPt, kLayer, kSecPt,
         *      stepTime, totalTime, dt, cmname,
         *      coordMp, direct, T, charLength, props,
         *      stateOld,
    c     Write only -
         *      stateNew, field )
    c
              include 'vaba_param.inc'
    c
              dimension jElemUid(nblock), coordMp(nblock,*),
         *      direct(nblock,3,3), T(nblock,3,3),
         *      charLength(nblock), props(nprops),
         *      stateOld(nblock,nstatev),
         *      stateNew(nblock,nstatev),
         *      field(nblock,nfieldv)
              character*80 cmname
    c
    c         Local arrays from vgetvrm are dimensioned to
    c         maximum block size (maxblk)
```

```
c
                parameter( nrData=6 )
                character*3 cData(maxblk*nrData)
                dimension rData(maxblk*nrData), jData(maxblk*nrData)
c
                jStatus = 1
                call vgetvrm( 'S', rData, jData, cData, jStatus )
c
                if( jStatus .ne. 0 ) then
                     call xplb_abqerr(-2, 'Utility routine VGETVRM failed '//
      *              'to get variable.',0,zero,'')
                     call xplb_exit
                end if
c
                call setField( nblock, nstatev, nfieldv, nrData,
      *              rData, stateOld, stateNew, field,ndir,nshr)
c
                jStatus = 1
                call vgetvrm( 'PEEQ', rData, jData, cData, jStatus )
c
                if( jStatus .ne. 0 ) then
                     call xplb_abqerr( -2, 'Utility routine VSETVM failed '//
      *              'to get variable.' ,0,zero,'')
                     call xplb_exit
                end if
                call splitPEEQ( nblock, nstatev, nfieldv, nrData,
      *              rData, stateOld, stateNew, field)
c
                return
                end
c
                subroutine setField( nblock, nstatev, nfieldv, nrData,
      *              stress, stateOld, statetNew, field,ndir,nshr )
c
                include 'vaba_param.inc'
c
                dimension stateOld(nblock,nstatev), stateNew(nblock,nstatev),
      *              field(nblock,nfieldv), stress(nblock,nrData)
c
                data pc, pt /1.d0, -1.d0/
c
                do k = 1, nblock
c
c    Compute pressure stress from stress tensor
c
                     press_value = 0.d0
                     do kk = 1, ndir
                          press_value = press_value + stress(k,kk)
                     enddo
                     press_value = -press_value/3.d0
c
c    Assign field variable based on value of pressure stress
c
                     field(k,1) = press_value
                     if(press_value.lt.pt)field(k,1) = pt
                     if(press_value.gt.pc)field(k,1) = pc
c
                     stateNew(k,1) = field(k,1)
                enddo
c
                return
                end
c
                subroutine splitPEEQ( nblock, nstatev, nfieldv, nrData,
      *              rData, stateOld, stateNew, field )
c
                include 'vaba_param.inc'
c
                dimension stateOld(nblock,nstatev), stateNew(nblock,nstatev),
      *              field(nblock,nfieldv), rData(nblock,nrData)
c
                do k = 1, nblock
                     fieldOld = stateOld(k,1)
                     peeqOld = stateOld (k,2)
                     peeqNew = rData (k,1)
                     dpeeq = peeqNew = peeqOld
                     stateNew(k,3) = stateOld(k,3)
                     stateNew(k,4) = stateOld(k,4)
```

```
            stateNew(k,5) = stateOld(k,5)
            if (fieldOld.le.pt)then
                statefNew(k,3) = stateOld(k,3) + dpeeq
            else if(fieldOld.ge.pc)then
                stateNew(k,4) = stateOld(k,4) + dpeeq
            else
                stateNew(k,5) = stateOld(k,5) + dpeeq
            endif
c
            stateNew(k,2) = peeqNew
```

Figure 10:
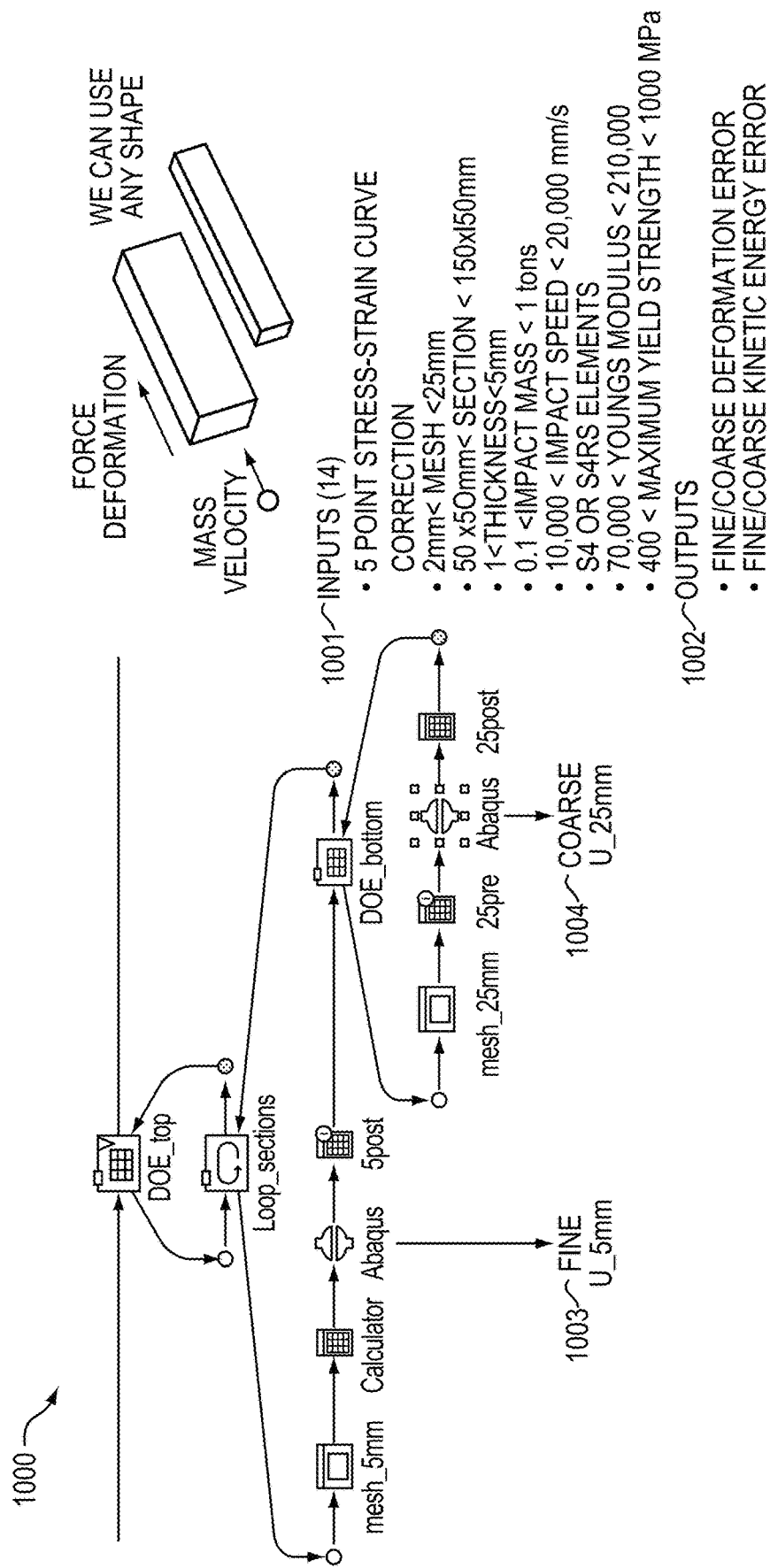
FIG. 10 is a flow diagram for determining corrections to material properties that may be implemented in embodiments.

As noted above, embodiments utilize a relationship between the mesh geometric property and the material property to modify the material property measurements or levels during the simulation. An embodiment determines the relationship by performing a plurality of simulations using a plurality of mesh-based models having varying element types, geometric dimensions, material properties, and impact scenario properties. In turn, the results of these simulations are analyzed using a machine learning analysis to identify material property corrections. FIG. 10 illustrates a method 1000 where simulations are performed using the inputs 1001 to generate the simulation results 1002. The method 1000 performs simulations 1003 using a mesh-based model with 5 mm size mesh elements and performs simulations 1004 using a mesh-based model with 25 mm size mesh elements. The results 1002 from these simulations 1003 and 1004 are then processed through a machine learning analysis to identify material property corrections as a function of the mesh geometric properties (mesh size in this example). In particular, the machine learning analysis determines material property corrections for which results from the simulations performed using a model with the 25 mm mesh size elements would be the same as the results from a simulation performed with the 5 mm mesh size elements. In this way, going forward, simulations can be performed using the 25 mm mesh, which will be much faster, while not compromising the quality of the simulation results.

It is noted that while mesh size is described in relation to the method 1000 and the machine learning FIG. 10, any variety of mesh geometric properties may be varied and the material properties may be modified in the same way so as to correct for discretization errors caused by the variations in the geometric properties. Further, according to an embodiment, a different relationship between mesh geometric properties and material properties is used for each physical behavior being simulated. In such an embodiment, the method 1000 is performed to determine the relationship for every different physics based phenomena, i.e., physical behavior, being simulated. For example, a relationship will be determined for shell mesh discretization and its effect on the vibration modes on the body in white structure, or between the volume mesh discretization of the "jelly roll" battery cell and its impact on vibration modes and impact loads for electrical cars. However, it is noted that embodiments are not limited to the specific models and scenarios covered by the machine learning performed using the method 1000. In other words, a relationship between material properties and mesh geometric properties determined for a given physical behavior using the method 1000 can be employed in any model simulation for that given behavior carried out as described herein.

FIG. 11 illustrates a design of experiments data set 1100 that includes inputs 1101, 1102, 1103, 1104, and 1105 and results (output) 1106 generated using the input parameters 1101-1105 in a machine learning method, e.g., the method 1000 depicted in FIG. 10. The input parameters include material data 1101, geometry data 1102, material softening data 1103, scenario data 1104, and mesh data 1105. Material data 1101 includes Young's Modulus, Yield Stress (stress during plastic deformation) and material density. The geometry 1102 of the test part includes a rectangular tube of variable height, width, and thickness. The material softening parameters 1103 describe the modification of the material property data curve. The scenario 1104 is described by various masses impacting the rectangular tube at various velocities. The mesh geometry 1105 includes a description of the average mesh geometry on the tube. The outputs 1106 (which are not all depicted in the data set 1100 of FIG. 11) include maximum axial deformation of the tube for 5 mm and the maximum absorbed energy in the tube, as well as the differences between those values and the values of the coarser 25 mm mesh. The results 1106 in the example data set 1100 were generated in about 2800 CPU hours (500,000×20 CPUs). A similar approach can be used for other mesh sizes such as 5 mm, 9 mm, 15 mm and 19 mm. This data can then be combined and processed using dimensional reduction technique(s) in order to produce a material correction model such that the errors in deformation and energy absorption are within 10%.

Figure 12:
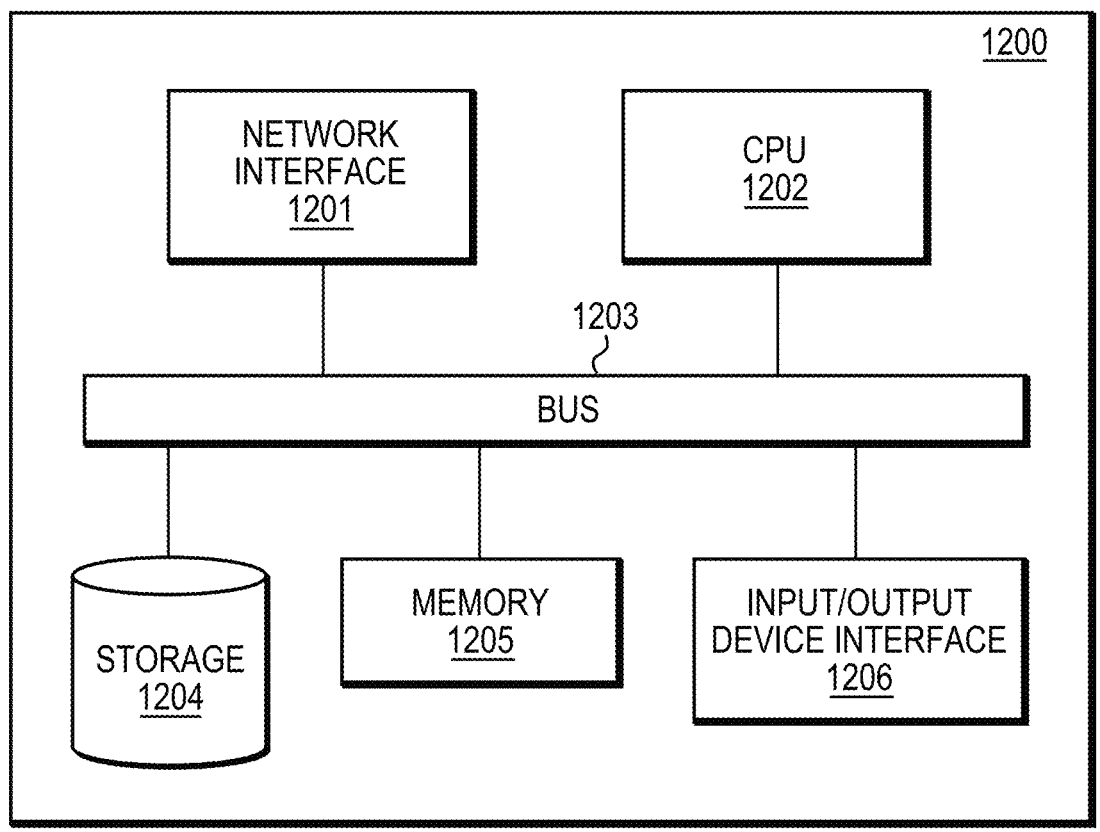
FIG. 12 is a simplified block diagram of a computer system for performing a computer-based simulation according to an embodiment.

FIG. 12 is a simplified block diagram of a computer-based system 1200 that may be used to simulate a real-world object according to any variety of the embodiments of the present invention described herein. The system 1200 comprises a bus 1203. The bus 1203 serves as an interconnect between the various components of the system 1200. Connected to the bus 1203 is an input/output device interface 1206 for connecting various input and output devices such as a keyboard, mouse, display, speakers, etc. to the system 1200. A central processing unit (CPU) 1202 is connected to the bus 1203 and provides for the execution of computer instructions. Memory 1205 provides volatile storage for data used for carrying out computer instructions. Storage 1204 provides non-volatile storage for software instructions, such as an operating system (not shown). The system 1200 also comprises a network interface 1201 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 1200, or a computer network environment such as the computer environment 1300, described herein below in relation to FIG. 13. The computer system 1200 may be transformed into the machines that execute the methods described herein, for example, by loading software instructions into either memory 1205 or non-volatile storage 1204 for execution by the CPU 1202. One of ordinary skill in the art should further understand that the system 1200 and its various components may be configured to carry out any embodiments or combination of embodiments of the present invention described herein. Further, the system 1200 may implement the various embodiments described herein utilizing any combination of hardware, software, and firmware modules operatively coupled, internally, or externally, to the system 1200.

Figure 13:
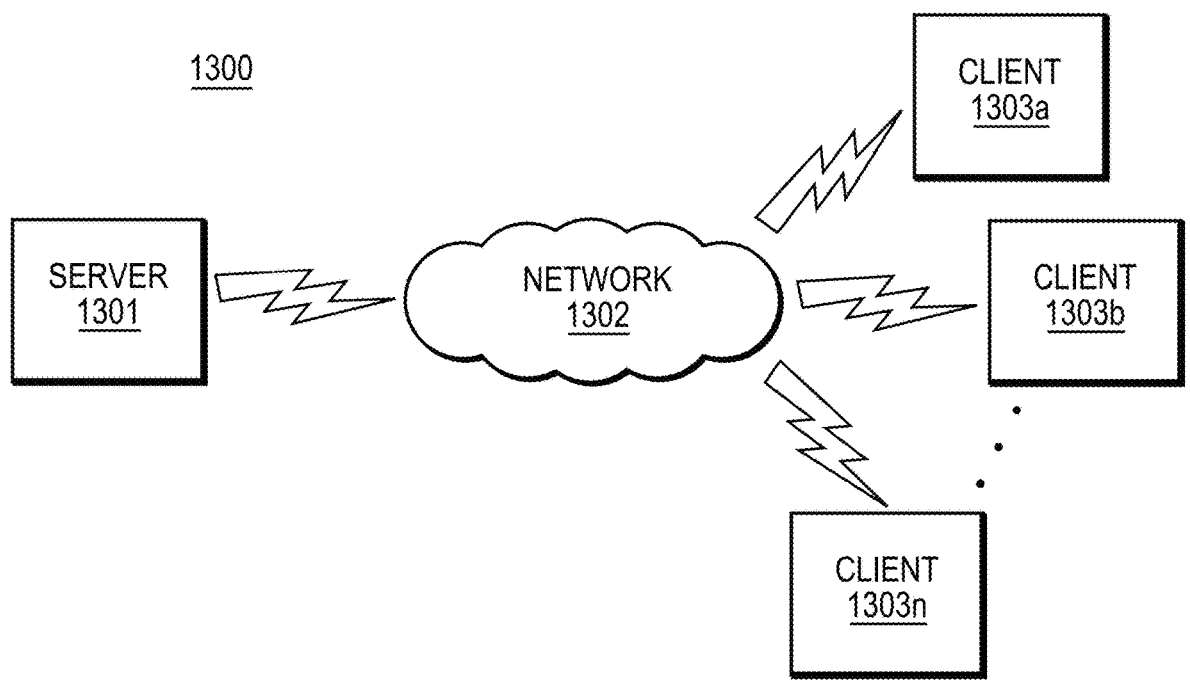
FIG. 13 is a simplified diagram of a computer network environment in which an embodiment of the present invention may be implemented.

FIG. 13 illustrates a computer network environment 1300 in which an embodiment of the present invention may be implemented. In the computer network environment 1300, the server 1301 is linked through the communications network 1302 to the clients 1303a-n. The environment 1300 may be used to allow the clients 1303a-n, alone or in combination with the server 1301, to execute any of the methods described herein. For non-limiting example, computer network environment 1300 provides cloud computing embodiments, software as a service (SAAS) embodiments, and the like.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While example embodiments have been particularly shown and described, it will be understood by those skilled in the art that various changes in form and details may be made therein without departing from the scope of the embodiments encompassed by the appended claims.

What is claimed is:

1. A computer-implemented method for performing a computer-based simulation, for designing a real-world object, the method comprising:
   obtaining a mesh-based model representing a real-world object, the mesh-based model composed of a plurality of mesh elements each having geometric properties;
   performing a simulation of physical behavior of the real-world object using the mesh-based model, performing the simulation including, for at least one mesh element of the plurality, correcting inaccuracies of the simulation caused by the geometric properties of the at least one mesh element by modifying values of material properties used in performing the simulation to calculate the physical behavior, wherein the values of the material properties are modified as a function of the geometric properties of the least one mesh element; and
   automatically identifying a design change of the real-world object based on results of the performed simulation, thereby designing the real-world object.

2. The method of claim 1 further comprising:
   automatically modifying the mesh-based model of the real-world object to correspond to the identified design change.

3. The method of claim 2 wherein the performing the simulation, identifying the design change, and modifying the mesh-based model are iterated automatically by a processor until an optimized design of the real-world object is determined.

4. The method of claim 1 wherein the mesh-based model is: a finite element model, a finite volume model, or a finite difference method model.

5. The method of claim 1 wherein the simulation is a finite element simulation.

6. The method of claim 1 wherein performing the simulation includes computing physical behavior in at least one of: a fluid domain, a structure domain, and an electromagnetic domain.

7. The method of claim 1 wherein the real-world object is an automobile, an airplane, a boat, a jet-engine, a building, a civil engineering structure, a reservoir, or a human.

8. The method of claim 1 wherein the real-world object is a thin wall metal shell.

9. The method of claim 1 wherein modifying values of the material properties as a function of the geometric properties includes modifying a data curve dictating physics-based behavior given the geometric properties.

10. The method of claim 9 wherein the physical behavior is plastic compression and metal folding and the data curve is a stress-strain curve.

11. The method of claim 10 wherein, in performing the simulation, the stress-strain curve is modified for periods of time in which the real-world object is undergoing the plastic compression behavior and the stress-strain curve is not modified for periods of time in which the real-world object is not undergoing the plastic compression behavior.

12. The method of claim 10 wherein, in performing the simulation, the modified stress-strain curve is applied to shell elements of the mesh-based model.

13. The method of claim 1 further comprising:
   performing a plurality of simulations using a plurality of mesh-based models having varying geometric properties; and
   identifying material property value modifications using a machine learning analysis of results from the plurality of simulations.

14. The method of claim 1 wherein the geometric properties include at least one of: a shell thickness, a vertex size, a mesh edge size, a mesh face size, a mesh polygon size, and a mesh surface size.

15. The method of claim 1 wherein the real-world object is subject to fluid flow.

16. The method of claim 1 wherein modifying the values of material properties as a function of the geometric properties includes modifying a given value dictating material behavior given the geometric properties.

17. The method of claim 16 wherein the physical behavior is fluid flow and the given value is viscosity.

18. A system for performing a computer-based simulation, for designing a real-world object, the system comprising:
- a processor; and
- a memory with computer code instructions stored thereon, the processor and the memory, with the computer code instructions, being configured to cause the system to:
  - obtain a mesh-based model representing a real-world object, the mesh-based model composed of a plurality of mesh elements each having geometric properties;
  - perform a simulation of physical behavior of the real-world object using the mesh-based model, performing the simulation including, for at least one mesh element of the plurality, correcting inaccuracies of the simulation caused by the geometric properties of the at least one mesh element by modifying values of material properties used in performing the simulation to calculate the physical behavior, wherein the values of the material properties are modified as a function of the geometric properties of the at least one mesh element; and
  - automatically identify a design change of the real-world object based on results of the performed simulation, thereby designing the real-world object.

19. A non-transitory computer program product for performing a computer-based simulation, for designing a real-world object, the computer program product executed by a server in communication across a network with one or more clients and comprising:
- a computer readable medium, the computer readable medium comprising program instructions which, when executed by a processor, causes the processor to:
  - obtain a mesh-based model representing a real-world object, the mesh-based model composed of a plurality of mesh elements each having geometric properties;
  - perform a simulation of physical behavior of the real-world object using the mesh-based model, performing the simulation including, for at least one mesh element of the plurality, correcting inaccuracies of the simulation caused by the geometric properties of the at least one mesh element by modifying values of material properties used in performing the simulation to calculate the physical behavior, wherein the values of the material properties are modified as a function of the geometric properties of the at least one mesh element; and
  - automatically identify a design change of the real-world object based on results of the performed simulation, thereby designing the real-world object.

* * * * *